(12) United States Patent
Noguchi et al.

(10) Patent No.: US 6,521,359 B1
(45) Date of Patent: *Feb. 18, 2003

(54) POLYMERIC FLUORESCENT SUBSTANCE AND POLYMER LIGHT EMITTING DEVICE

(75) Inventors: Takanobu Noguchi, Tsukuba (JP); Shuji Doi, Tsukuba (JP); Makoto Kitano, Toyonaka (JP); Fumi Yamaguchi, Tsuchiura (JP)

(73) Assignee: Sumitomo Chemical Company, Limited, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/540,901

(22) Filed: Mar. 31, 2000

(30) Foreign Application Priority Data

Apr. 9, 1999 (JP) ............................. 11-102531
Apr. 21, 1999 (JP) ............................. 11-113896
Apr. 21, 1999 (JP) ............................. 11-113897

(51) Int. Cl.$^7$ .................... H05B 33/14; C08G 61/00
(52) U.S. Cl. .................. 428/690; 428/691; 428/917; 428/704; 313/504; 313/506; 528/129; 528/153; 528/154; 528/230; 528/244; 528/247; 528/248; 528/266; 528/269; 528/373; 528/397
(58) Field of Search ................... 428/690, 691, 428/917, 704; 313/504, 506; 528/129, 153, 154, 230, 244, 247, 248, 373, 266, 397, 269; 257/40, 103; 252/301.16, 301.35

(56) References Cited

U.S. PATENT DOCUMENTS 5,759,709 A * 6/1998 Doi et al. .................. 428/690
5,853,905 A * 12/1998 So et al. .................... 428/690
5,874,179 A * 2/1999 Kreuder et al. ............ 428/690
6,207,301 B1 * 3/2001 Ohnishi et al. ............ 428/690

FOREIGN PATENT DOCUMENTS

DE      195 05 416 A1    8/1996
DE      195 05 416 A     8/1996
EP      0 725 120 A1     8/1996
EP      0 825 242 A2     2/1998

OTHER PUBLICATIONS

Database WPI Derwent Publications Ltd., London, GB; AN 1996–356092 & XP002185835, Abstract of JP09/045478 A, Feb. 14, 1997.
Database WPI Derwent Publications Ltd., London, GB; AN 1993–285588 XP002185836. Abstract of JP05/202355 A, Aug. 10, 1993.
JP 09 45478 A, Abstract, Database WPI Derwent Publications LTD, XP002185835, Feb. 14, 1997.
JP 05 202355 A, Abstract, Database WPI Derwent Publications LTD, XP002185836, Aug. 10, 1993.
Zheng M. et al.: "Photoluminescence of Poly (1,4–phenylenevinylene) Derivatives in Solution and Film" Polymers for Advanced Technologies, John Wiley and Sons, Chichester, GB, vol. 10, No. 7 Jul. 1999, pp. 476–480, XP000852427 ISSN: 1042–7147 *p. 47*.

\* cited by examiner

Primary Examiner—Deborah Jones
Assistant Examiner—Ling Xu
(74) Attorney, Agent, or Firm—Sughrue Mion, PLLC

(57) ABSTRACT

Provided is a polymeric fluorescent substance which emits a fluorescence in a solid state, which comprises the following repeating unit in an amount of 20 mol % or more based on the total amount of all repeating units,

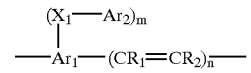

in the formula, $X_1$ represents a group selected from the group consisting of $-CR_3=CR_4-$, $-C\equiv C-$, $-SiR_5R_6-$, $-NR_7-$, $-CO-$, $-CO-O-$, $-O-CO-$, $-SO_2-$, a carbon-carbon single bond, $-O-$ and $-S-$.

The polymeric fluorescent substance has strong fluorescence, and can be suitably used as a polymer LED and a dye for laser.

15 Claims, No Drawings

POLYMERIC FLUORESCENT SUBSTANCE AND POLYMER LIGHT EMITTING DEVICE

BACKGROUND OF THE INVENTION

1. Field of the Invention

The present invention relates to a polymeric fluorescent substance, a polymer light emitting device (hereinafter, referred to as polymer LED) containing the same in an light emitting layer, and a device using the same.

2. Description of the Related Art

Inorganic electroluminescence devices (hereinafter, sometimes referred to as inorganic EL device) using an inorganic luminescent material as a light emitting material are used for example for flat light sources as back-lights and displays such as a flat panel display and the like, however, an alternating current of high voltage has been required for light emission.

Recently, Tang et al. fabricated an organic electroluminescence device (hereinafter, sometimes referred to as organic EL device) having a double-layer structure in which an organic fluorescent dye as a light emitting layer is laminated with an organic charge transport compound used in photosensitive layer for electrophotography and the like (Japanese Patent Application Laid-Open (JP-A) No. 59-194393). Since organic EL devices have characteristics that light emissions of a lot of colors are obtained easily in addition to low voltage driving and high luminance as compared with inorganic EL devices, there have been reported a lot of trials regarding device structures, organic fluorescent dyes and organic charge transport compounds of organic EL devices [Jpn. J. Appl. Phys., 27, L269 (1988), J. Appl. Phys., 65, 3610 (1989)].

Further, apart from organic EL devices using mainly organic compounds having a lower molecular weight, polymer light emitting devices (hereinafter, sometimes referred to as polymer LEDs) using light emitting materials having a higher molecular weight have been proposed in such as WO 9013148 published specification, JP-A NO. 3-244630, Appl. Phys. Lett., 58, 1982 (1991). WO9013148 discloses in the Examples an EL device using a thin film of poly(p-phenylene vinylene) obtained by forming a film of a soluble precursor on the electrode and subjecting it to a heat treatment to convert the precursor into a conjugated polymer.

Further, JP-A 3-244630 has exemplified a conjugated polymers having a feature that they are themselves soluble in a solvent and needs no heat treatment. Also in Appl. Phys. Lett., 58, 1982 (1991), a polymeric light emitting materials soluble in a solvent and a polymer LED fabricated using the same are described.

Polymer LEDs are advantageous for formation of a film having large area and reduction in cost since an organic layer can be easily formed by coating, as compared with the case of vapor deposition of a material having a lower molecular weight, and the mechanical strength of the resulting film is believed to be high because of a high molecular weight thereof.

Conventionally, as the light emitting materials used in these polymer LEDs, there have been reported polyfluorene (Jpn. J. Appl. Phys., 30, L1941 (1991)), poly p-phenylene derivative (Adv. Mater., 4, 36 (1992)) and the like, in addition to the above-described poly(p-phenylene vinylene).

As light emitting materials having other than linear or branched alkyl groups, alkoxy groups or aryl groups as a side chain, there have been reported a polythiophene derivative having a cycloalkyl group as a side chain (Nature, 372, 444 (1994)), and poly(p-phenylenevinvlene) having an alkoxy group of a cholesteric compound (WO94/20589 published specification).

PPV having a phenyethenyl group as a side chain has been reported in Macromolecules, 27, No. 19, 5239 (1994). Since this polymer is not necessarily soluble in a solvent, a PPV derivative thin film is obtained by forming a thin film of an intermediate then by conducting heat treatment, however, the light emitting property of this polymer was not known.

However, there have been required further improvements in the quantum yield of luminescence of light emitting materials, and the driving voltage and light emitting efficiency of light emitting materials when used in polymer LEDs.

The object of the present invention is to provide a polymeric fluorescent substance emitting strong fluorescence, a polymer LED and a device having high performance which can be driven at low voltage at high efficiency by using the polymeric fluorescent substance.

SUMMARY OF THE INVENTION

The present inventors have intensively studied in view of such conditions, and resultantly found that a polymeric fluorescent substance containing a repeating unit having a specific substituent emits especially strong fluorescence and a polymer LED and a device having high performance which can be driven at low voltage at high efficiency are obtained by using this polymeric fluorescent substance, completing the present invention.

Namely, the present invention relates to

[1] a polymeric fluorescent substance which emits a fluorescence in a solid state, has a number-average molecular weight of $10^3$ to $10^8$ in terms of polystyrene, comprises one or more repeating units of the following formula (1) and in which the total amount of the above-described repeating units is 20 mol % or more based on the total amount of all repeating units:

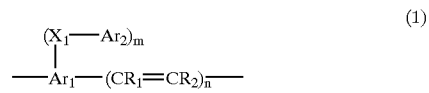

(wherein, $Ar_1$ is an arylene group of 6 to 60 carbon atoms contained in the main chain or a heterocyclic compound group of 4 to 60 carbon atoms contained in the main chain. $Ar_2$ is a group selected from the group consisting of aryl groups of 6 to 60 carbon atoms, heterocyclic compound groups of 4 to 60 carbon atoms and cyclic saturated hydrocarbon groups of 5 to 16 carbon atoms. $X_1$ represents a group selected from the group consisting of —$CR_3$=$CR_4$—, —C≡C—, —$SiR_5R_6$—, —$NR_7$—, —CO—, —CO—O—, —O—CO— and —$SO_2$—. $Ar_2$ has at least one substituent selected from the group consisting of alkyl groups of 5 to 20 carbon atoms, alkoxy groups of 5 to 20 carbon atoms, alkylthio groups of 5 to 20 carbon atoms, alkylsilyl groups of 5 to 60 carbon atoms, alkylamino groups of 5 to 40 carbon atoms, aryl groups of 6 to 60 carbon atoms, aryloxy groups of 6 to 60 carbon atoms, arylalkyl groups of 7 to 60 carbon atoms, arylalkoxy groups of 7 to 60 carbon atoms, arylalkenyl groups of 8 to 60 carbon atoms, arylalkynyl groups of 8 to 60 carbon atoms, arylamino groups of 6 to 60 carbon atoms, heterocyclic compound groups of 4 to 60 carbon atoms and a cyano group. $Ar_2$ may also have other substituent than these substituents. When $Ar_2$ have a plurality of substituents, they may be the same or different. m is an integer from 1 to 4. $Ar_1$ may also have other substituent than substituents represented by $-X_1-Ar_2$. When $Ar_1$ have a plurality of substituents, they may be the same or different. $R_1$ to $R_7$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. When the substituent of $Ar_2$, or $R_1$ to $R_7$ include an alkyl chain, the alkyl chain may be any of linear, branched and cyclic, alternatively, and ends of a plurality of alkyl groups may bond to form a ring. One or more $-CH_2-$ groups contained in this alkyl chain may also be replaced with a group selected from the group consisting of $-O-$, $-S-$, $-CR_8=CR_9-$, $-C\equiv C-$, $-SiR_{10}R_{11}-$, $-NR_{12}-$, $-CO-$, $-CO-O-$, $-O-CO-$ and $-SO_2-$. When the substituent of $Ar_2$, or $R_1$ to $R_7$ include an aryl group or a heterocyclic compound group, they may also further have a substituent. Herein, $R_8$ to $R_{12}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. One or more hydrogen atoms contained in the repeating unit of the formula (1) may also be replaced with halogen atoms selected from the group consisting of F, Cl and Br. And, n is 0 or 1.).

Further, the present invention relates to

[2] a polymeric fluorescent substance which emits a fluorescence in a solid state, has a number-average molecular weight of $10^3$ to $10^8$ in terms of polystyrene, comprises one or more repeating units of the following formula (2) and in which the total amount of the above-described repeating units is 20 mol % or more based on the total amount of all repeating units:

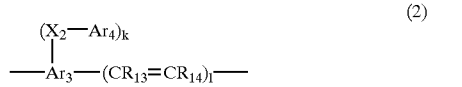

(2)

(wherein, $Ar_3$ is an arylene group of 6 to 60 carbon atoms contained in the main chain or a heterocyclic compound group having 4 to 60 carbon atoms contained in the main chain and having one or more atoms selected from nitrogen, oxygen and silicon. $Ar_4$ is a group selected from the group consisting of cyclic saturated hydrocarbon groups of 5 to 16 carbon atoms and saturated heterocyclic compound groups of 4 to 60 carbon atoms. $X_2$ represents a group selected from the group consisting of a carbon-carbon single bond, $-O-$ and $-S-$. $Ar_4$ has at least one substituent selected from the group consisting of alkyl groups of 1 to 20 carbon atoms, alkoxy groups of 1 to 20 carbon atoms, alkylthio groups of 1 to 20 carbon atoms, alkylsilyl groups of 1 to 60 carbon atoms, alkylamino groups of 1 to 40 carbon atoms, aryl groups of 6 to 60 carbon atoms, aryloxy groups of 6 to 60 carbon atoms, arylalkyl groups of 7 to 60 carbon atoms, arylalkoxy groups of 7 to 60 carbon atoms, arylalkenyl groups of 8 to 60 carbon atoms, arylalkynyl groups of 8 to 60 carbon atoms, arylamino groups of 6 to 60 carbon atoms, heterocyclic compound groups of 4 to 60 carbon atoms and a cyano group. $Ar_4$ may also have other substituent than these substituents. When $Ar_4$ have a plurality of substituents, they may be the same or different. k is an integer from 1 to 4. $Ar_3$ may also have other substituent than substituents represented by $-X_2-Ar_4$. When $Ar_3$ have a plurality of substituents, they may be the same or different. $R_{13}$ and $R_{14}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. When the substituent of $Ar_4$, or $R_{13}$ and $R_{14}$ include an alkyl chain, the alkyl chain may be any of linear, branched and cyclic, alternatively, and ends of a plurality of alkyl groups may bond to form a ring. One or more $-CH_2-$ groups contained in this alkyl chain may also be replaced with a group selected from the group consisting of $-O-$, $-S-$, $-CR_{15}=CR_{16}-$, $-C\equiv C-$, $-SiR_{17}R_{18}-$, $-NR_{19}-$, $-CO-$, $-CO-O-$, $-O-CO-$ and $-SO_2-$. When the substituent of $Ar_4$, or $R_{13}$ and $R_{14}$ include an aryl group or a heterocyclic compound group, they may also further have a substituent. Herein, $R_{15}$ to $R_{19}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. One or more hydrogen atoms contained in the repeating unit of the formula (2) may also be replaced with halogen atoms selected from the group consisting of F, Cl and Br. And, l is 0 or 1.).

Further, the present invention relates to

[3] a polymeric fluorescent substance which emits a fluorescence in a solid state, has a number-average molecular weight of $10^3$ to $10^8$ in terms of polystyrene, comprises one or more repeating units of the following formula (3) and one or more repeating units of the following formula (4) respectively, and in which the amount of the repeating units of the formula (3) is not less than 0.1 mol % and not more than 20 mol % based on the total amount of all repeating units and the total amount of the above-described repeating units of the formulae (3) and (4) is 50 mol % or more based on the total amount of all repeating units:

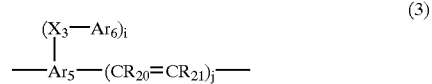

(3)

(wherein, $Ar_5$ is an arylene group of 6 to 60 carbon atoms contained in the main chain or a heterocyclic compound group of 4 to 60 carbon atoms contained in the main chain. $Ar_6$ is a group selected from the group consisting of aryl groups of 6 to 60 carbon atoms, heterocyclic compound groups of 4 to 60 carbon atoms and cyclic saturated hydrocarbon groups of 5 to 16 carbon atoms. $Ar_6$ may also further have a substituent. When $Ar_6$ have a plurality of substituents, they may be the same or different. $X_3$ represents a group selected from the group consisting of —O—, —S—, —$CR_{22}$=$CR_{23}$—, —C≡C—, —$SiR_{24}R_{25}$—, —$NR_{26}$—, —CO—, —CO—O—, —O—CO— and —$SO_2$—. i is an integer from 1 to 4. $Ar_5$ may also have other substituent than substituents represented by —$X_3$—$Ar_6$. When $Ar_5$ have a plurality of substituents, they may be the same or different. $R_{20}$ to $R_{26}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. When the substituent of $Ar_4$, or $R_{15}$ to $R_{21}$ include an alkyl chain, the alkyl chain may be any of linear, branched and cyclic, alternatively, and ends of a plurality of alkyl groups may bond to form a ring. One or more —$CH_2$— groups contained in this alkyl chain may also be replaced with a group selected from the group consisting of —O—, —S—, —$CR_{27}$=$CR_{28}$—, —C≡C—, —$SiR_{29}R_{30}$—, —$NR_{31}$—, —CO—, —CO—O—, —O—CO— and —$SO_2$—. When the substituent of $Ar_6$, or $R_{20}$ to $R_{26}$ include an aryl group or a heterocyclic compound group, they may also further have a substituent. Herein, $R_{27}$ to $R_{31}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. One or more hydrogen atoms contained in the repeating unit of the formula (3) may also be replaced with halogen atoms selected from the group consisting of F, Cl and Br. And, j is 0 or 1.),

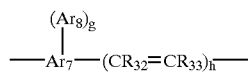

(4)

(wherein, $Ar_7$ is an arylene group of 6 to 60 carbon atoms contained in the main chain or a heterocyclic compound group of 4 to 60 carbon atoms contained in the main chain. $Ar_8$ is a group selected from the group consisting of alkyl groups of 5 to 20 carbon atoms, aryl groups of 6 to 60 carbon atoms, arylalkyl groups of 7 to 60 carbon atoms and heterocyclic compound groups of 4 to 60 carbon atoms. $Ar_8$ may also further have a substituent. When $Ar_8$ have a plurality of substituents, they may be the same or different. g is an integer from 1 to 4. $Ar_7$ may also have other substituent than $Ar_8$. When $Ar_7$ have a plurality of substituents, they may be the same or different. $R_{32}$ and $R_{33}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. When the substituent of $Ar_8$, or $R_{32}$ and $R_{33}$ include an alkyl chain, the alkyl chain may be any of linear, branched and cyclic, alternatively, and ends of a plurality of alkyl groups may bond to form a ring. One or more —$CH_2$— groups contained in this alkyl chain may also be replaced with a group selected from the group consisting of —O—, —S—, —$CR_{34}$=$CR_{35}$—, —C≡C—, —$SiR_{36}R_{37}$—, —$NR_{38}$—, —CO—, —CO—O—, —O—CO— and —$SO_2$—. When the substituent of $Ar_8$, or $R_{32}$ and $R_{33}$ include an aryl group or a heterocyclic compound group, they may also further have a substituent. Herein, $R_{34}$ to $R_{38}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. One or more hydrogen atoms contained in the repeating unit of the formula (4) may also be replaced with halogen atoms selected from the group consisting of F, Cl and Br. And, h is 0 or 1.).

Furthermore, the present invention relates to

[4] a polymeric fluorescent substance which emits a fluorescence in a solid state, has a number-average molecular weight of $10^3$ to $10^8$ in terms of polystyrene, comprises one or more repeating units of the following formula (5) and one or more repeating units of the following formula (6) respectively, and in which the amount of the repeating units of the formula (5) is not less than 0.1 mol % and not more than 20 mol % based on the total amount of all repeating units and the total amount of the above-described repeating units of the formulae (5) and (6) is 50 mol % or more based on the total amount of all repeating units:

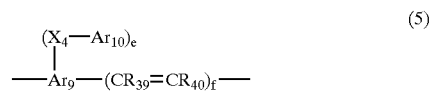

(5)

(wherein, $Ar_9$ is an arylene group of 6 to 60 carbon atoms contained in the main chain or a heterocyclic compound group of 4 to 60 carbon atoms contained in the main chain. $Ar_{10}$ is an alkyl group of 5 to 20 carbon atoms or an arylalkyl group of 7 to 60 carbon atoms. $X_4$ represents a group selected from the group consisting of —$CR_{41}$=$CR_{42}$—, —C≡C—, —$SiR_{43}R_{44}$—, —$NR_{45}$—, —CO—, —CO—O—, —O—CO— and —$SO_2$—. e is an integer from 1 to 4. $Ar_9$ may also have other substituent than substituents represented by —$X_4$—$Ar_{10}$. When $Ar_9$ have a plurality of substituents, they may be the same or different. $R_{39}$ to $R_{45}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. When the substituent of $Ar_{10}$, or $R_{39}$ and $R_{45}$ include an alkyl chain, the alkyl chain may be any of linear, branched and cyclic, alternatively, and ends of a plurality of alkyl groups may bond to form a ring. One or more —$CH_2$— groups contained in this alkyl chain may also be replaced with a group selected from the group consisting of —O—, —S—, —$CR_{46}$=$CR_{47}$—, —C≡C—, —$SiR_{48}R_{49}$—, —$NR_{50}$—, —CO—, —CO—O—, —O—CO— and —$SO_2$—. When the substituent of $Ar_{10}$, or $R_{39}$ to $R_{45}$ include an aryl group or a heterocyclic compound group, they may also further have a substituent. Herein, $R_{46}$ to $R_{50}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. One or more hydrogen atoms contained in the repeating unit of the formula (5) may also be replaced with halogen atoms selected from the group consisting of F, Cl and Br. And, f is 0 or 1.),

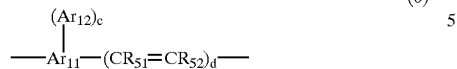
(6)

(wherein, $Ar_{11}$ is an arylene group of 6 to 60 carbon atoms contained in the main chain or a heterocyclic compound group of 4 to 60 carbon atoms contained in the main chain. $Ar_{12}$ is a group selected from the group consisting of alkyl groups of 5 to 20 carbon atoms, aryl groups of 6 to 60 carbon atoms, arylalkyl groups of 7 to 60 carbon atoms and heterocyclic compound groups of 4 to 60 carbon atoms. $Ar_{12}$ may also further have a substituent. When $Ar_{12}$ have a plurality of substituents, they may be the same or different. C is an integer from 1 to 4. $Ar_{11}$ may also have other substituent than $Ar_{12}$. When $Ar_{11}$ have a plurality of substituents, they may be the same or different. $R_{51}$ and $R_{52}$ each independently represents a group selected from the group consisting of a hydrogen atom, alkyl groups of 1 to 20 carbon atoms, aryl 4 groups of 6 to 60 carbon atoms, heterocyclic compound groups of 4 to 60 carbon atoms and a cyano group. When the substituent of $Ar_{12}$, or $R_{51}$ and $R_{52}$ include an alkyl chain, the alkyl chain may be any of linear, branched and cyclic, alternatively, and ends of a plurality of alkyl groups may bond to form a ring. One or more —$CH_2$— groups contained in this alkyl chain may also be replaced with a group selected from the group consisting of —O—, —S—, —$CR_{53}$=$CR_{54}$—, —C≡C—, —$SiR_{55}R_{56}$—, —$NR_{57}$—, —CO—, —CO—O—, —O—CO— and —$SO_2$—. When $R_{51}$ and $R_{52}$ include an aryl group or a heterocyclic compound group, they may also further have a substituent. Herein, $R_{53}$ to $R_{57}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. One or more hydrogen atoms contained in the repeating unit of the formula (6) may also be replaced with halogen atoms selected from the group consisting of F, Cl and Br. And, d is 0 or 1.).

Still further, the present invention relates to

[5] a polymeric fluorescent substance which emits a fluorescence in a solid state, has a number-average molecular weight of $10^3$ to $10^8$ in terms of polystyrene, comprises one or more repeating units of the following formula (7) and one or more repeating units of the following formula (8) respectively, and in which the total amount of the above-described repeating units of the formulae (7) and (8) is 50 mol % or more based on the total amount of all repeating units and the amount of the repeating units of the formula (7) is not less than 0.1 mol % and not more than 9 mol % based on the total amount of the repeating units of the formulae (7) and (8):

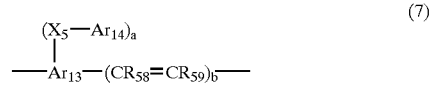
(7)

(wherein, $Ar_{13}$ is an arylene group of 6 to 60 carbon atoms contained in the main chain or a heterocyclic compound group of 4 to 60 carbon atoms contained in the main chain. $Ar_{14}$ is an alkyl group of 5 to 20 carbon atoms or an arylalkyl group of 7 to 60 carbon atoms. $Ar_{14}$ may also have a substituent. When $Ar_{14}$ have a plurality of substituents, they may be the same or different. $X_5$ represents a group selected from the group consisting of —O— and —S—. a is an integer from 1 to 4. $Ar_{13}$ may also have other substituent than substituents represented by —$X_5$—$Ar_{14}$. When $Ar_{13}$ have a plurality of substituents, they may be the same or different. $R_{58}$ and $R_{59}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. When the substituent of $Ar_{14}$, or $R_{58}$ and $R_{59}$ include an alkyl chain, the alkyl chain may be any of linear, branched and cyclic, alternatively, and ends of a plurality of alkyl groups may bond to form a ring. One or more —$CH_2$— groups contained in this alkyl chain may also be replaced with a group selected from the group consisting of —O—, —S—, —$CR_{60}$=$CR_{61}$—, —C≡C—, —$SiR_{62}R_{63}$—, —$NR_{64}$—, —CO—, —CO—O—, —O—CO— and —$SO_2$—. When the substituent of $Ar_{14}$, or $R_{58}$ to $R_{59}$ include an aryl group or a heterocyclic compound group, they may also further have a substituent. Herein, $R_{60}$ to $R_{64}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. One or more hydrogen atoms contained in the repeating unit of the formula (7) may also be replaced with halogen atoms selected from the group consisting of F, Cl and Br. And, b is 0 or 1.),

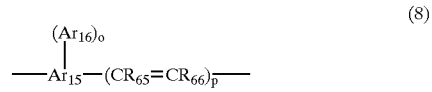
(8)

(wherein, $Ar_{15}$ is an arylene group of 6 to 60 carbon atoms contained in the main chain or a heterocyclic compound group of 4 to 60 carbon atoms contained in the main chain. $Ar_{16}$ is an alkyl group of 5 to 20 carbon atoms or an arylalkyl group of 7 to 60 carbon atoms. $Ar_{16}$ may also further have a substituent. When $Ar_{16}$ have a plurality of substituents, they may be the same or different. o is an integer from 1 to 4. $Ar_{15}$ may also have other substituent than $Ar_{16}$. When $Ar_{15}$ have a plurality of substituents, they may be the same or different. $R_{65}$ and $R_{66}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. When the substituent of $Ar_6$, or $R_{65}$ and $R_{66}$ include an alkyl chain, the alkyl chain may be any of linear, branched and cyclic, alternatively, and ends of a plurality of alkyl groups may bond to form a ring. One or more —$CH_2$— groups contained in this alkyl chain may also be replaced with a group selected from the group consisting of —O—, —S—, —$CR_{67}$=$CR_{68}$—, —C≡C—, —$SiR_{69}R_{70}$—, —$NR_{71}$—, —CO—, —CO—O—, —O—CO— and —$SO_2$—. When the substituent of $Ar_{16}$ or $R_{65}$ and $R_{66}$ include an aryl group or a heterocyclic compound group, they may also further have a substituent. Herein, $R_{67}$ to $R_{71}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group. One or more hydrogen atoms contained in the repeating unit of the formula (8) may also be replaced with halogen atoms selected from the group consisting of F, Cl and Br. And, p is 0 or 1.).

Further, the present invention relates to

[6] a polymer light emitting device comprising a pair of electrodes composed of an anode and a cathode at least one of which is transparent or semitransparent and at least one light emitting layer disposed between the electrodes, wherein the polymeric fluorescent substance of any of [1] to [5] is contained in the above-described light emitting layer.

Further, the present invention relates to

[7] the polymer light emitting device according to [6] wherein a layer containing an conducting polymer is disposed at least between one electrode and the light emitting layer so that the layer containing an conducting polymer is adjacent to the above-described electrode.

Further, the present invention relates to

[8] the polymer light emitting device according to [6] wherein an insulation layer having a thickness of 2 nm or less is disposed at least between one electrode and the light emitting layer so that the insulation layer is adjacent to the above-described electrode.

Further, the present invention relates to

[9] the polymer light emitting device according to any of [6] to [8] wherein a layer comprising an electron transporting compound is disposed between the cathode and the light emitting layer so that the layer comprising an electron transporting compound is adjacent to the above-described light emitting layer.

Further, the present invention relates to

[10] the polymer light emitting device according to any of [6] to [8] wherein a layer comprising a hole transporting compound is disposed between the anode and the light emitting layer so that the layer comprising a hole transporting compound is adjacent to the above-described light emitting layer.

Further, the present invention relates to

[11] the polymer light emitting device according to any of [6] to [8] wherein a layer comprising an electron transporting compound is disposed between the cathode and the light emitting layer so that the layer comprising an electron transporting compound is adjacent to the above-described light emitting layer, and a layer comprising a hole transporting compound is disposed between the anode and the light emitting layer so that the layer comprising a hole transporting compound is adjacent to the above-described light emitting layer.

Further, the present invention relates to

[12] a flat light source obtained by using the polymer light emitting device of any of [6] to [11].

Further, the present invention relates to

[13] a segment display obtained by using the polymer light emitting device of any of [6] to [11].

Further, the present invention relates to

[14] a dot matrix display obtained by using the polymer light emitting device of any of [6] to [11].

Further, the present invention relates to

[15] a liquid crystal display obtained by using the polymer light emitting device of any of [6] to [11] as a backlight.

DETAILED DESCRIPTION OF THE INVENTION

The polymeric fluorescent substance, and the polymer LED and device obtained by using the same, of the present invention will be described below in detail.

One embodiment of the polymeric fluorescent substance of the present invention is a polymeric fluorescent substance which comprises one or more units represented by the above-described formula (1) or the formula (2) and in which the total amount of the above-described repeating units is 20 mol % or more based on the total amount of all repeating units. It is more preferable that the total amount of the above-described repeating units is 50 mol % or more based on the total amount of all repeating units, though differs depending on the structure of the repeating unit.

Further, other embodiment of the polymeric fluorescent substance of the present invention is a polymeric fluorescent substance which comprises one or more repeating units of the above-described formula (3) and one or more repeating units of the above-described formula (4) respectively, and in which the amount of the repeating units of the formula (3) is not less than 0.1 mol % and not more than 20 mol % based on the total amount of all repeating units and the total amount of the above-described repeating units of the formulae (3) and (4) is 50 mol % or more based on the total amount of all repeating units: a polymeric fluorescent substance which comprises one or more repeating units of the above-described formula (5) and one or more repeating units of the above-described formula (6) respectively, and in which the amount of the repeating units of the formula (5) is not less than 0.1 mol % and not more than 20 mol % based on the total amount of all repeating units and the total amount of the above-described repeating units of the formulae (5) and (6) is 50 mol % or more based on the total amount of all repeating units: or a polymeric fluorescent substance which comprises one or more repeating units of the above-described formula (7) and one or more repeating units of the above-described formula (8) respectively, and in which the amount of the repeating units of the formula (7) is not less than 0.1 mol % and not more than 9 mol % based on the total amount of the repeating units of the formulae (7) and (8) and the total amount of the above-described repeating units of the formulae (7) and (8) is 50 mol % or more based on the total amount of all repeating units. It is preferable that each amount of the repeating units of the formula (3) or the formula (5) is not less than 0.1 mol % and not more than 9 mol %, though differs depending on the structure of the repeating unit.

Herein, $Ar_1$, $Ar_5$, $Ar_7$, $Ar_9$, $Ar_{11}$, $Ar_{13}$ and $Ar_{15}$ each independently is an arylene group of 6 to 60 carbon atoms contained in the main chain or a heterocyclic compound group of 4 to 60 carbon atoms contained in the main chain.

These groups may be advantageously selected so as not to deteriorate the luminescent property of the polymeric fluorescent substance, and specific examples thereof include divalent groups exemplified in the following chemical formulae 9 to 22.

Further, examples of $Ar_3$ include arylene groups of 6 to 60 carbon atoms contained in the main chain or heterocyclic compound groups having 4 to 60 carbon atoms contained in the main chain and having one or more atoms selected from the group consisting of nitrogen, oxygen and silicon, and exclude heterocyclic compound groups which do not have one or more atoms selected from the group consisting of nitrogen, oxygen and silicon, among divalent groups exemplified in the following chemical formulae 9 to 22.

[Chemical formulae 9]

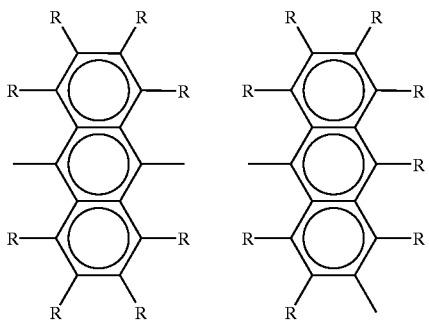

[Chemical formulae 10]

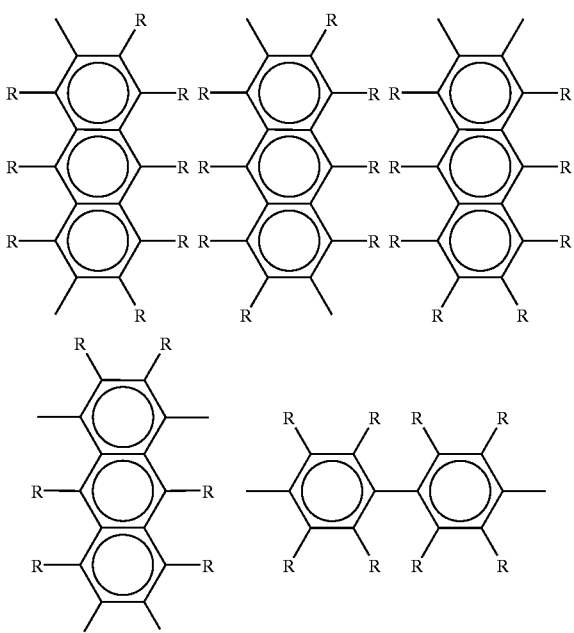

[Chemical formulae 11]

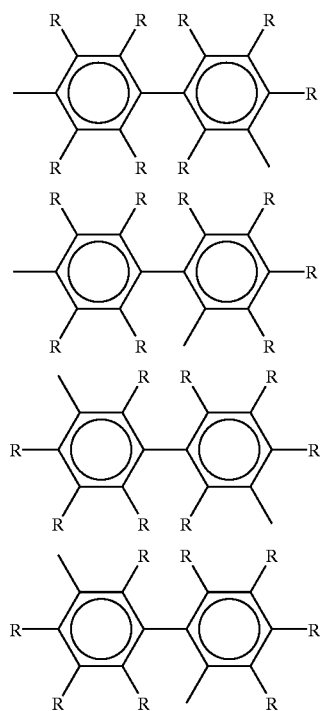

-continued
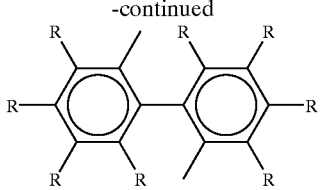
[Chemical formulae 12]
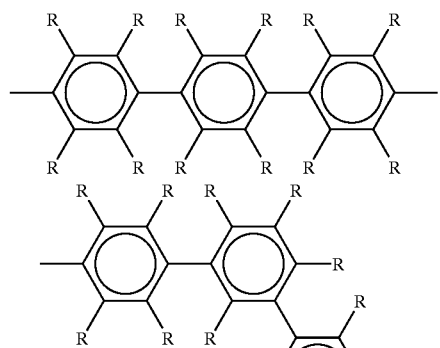
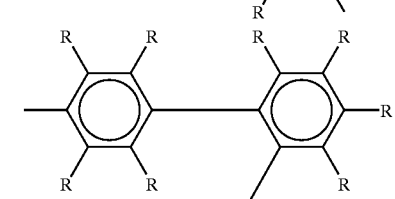
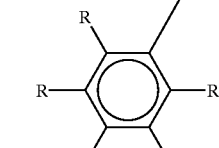
[Chemical formulae 13]
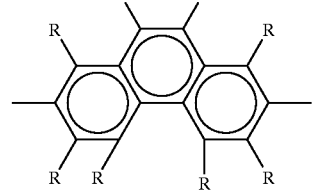
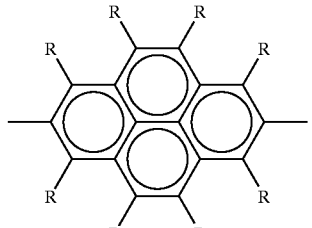
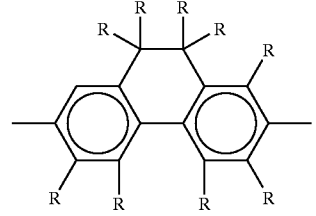
-continued
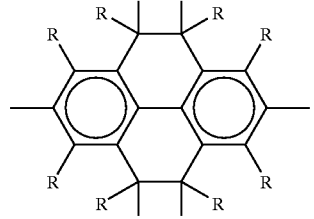
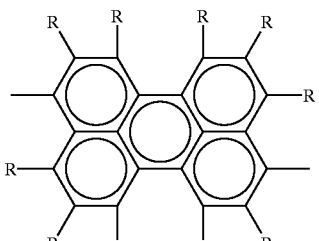
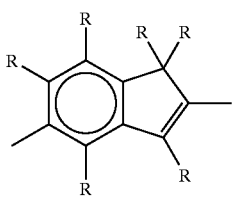 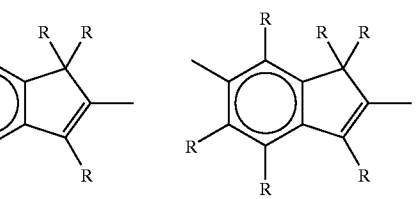
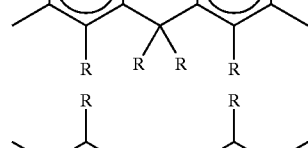
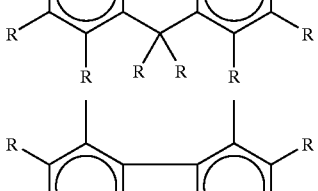
[Chemical formulae 14]
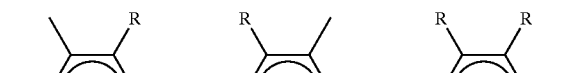
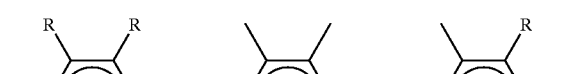
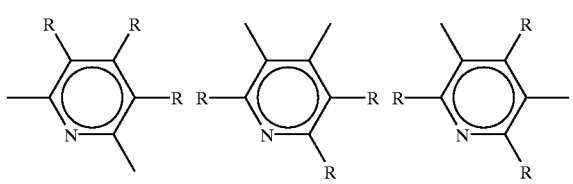

-continued
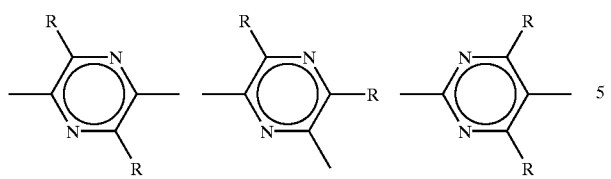
[Chemical formulae 15]
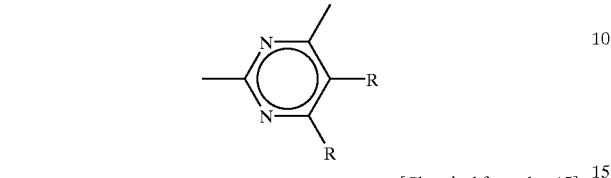
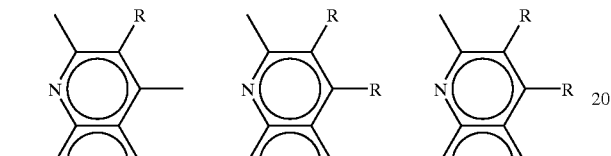
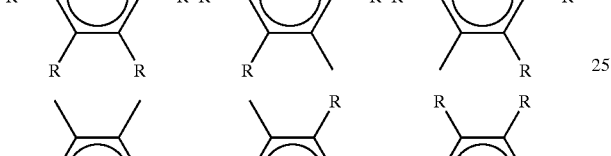
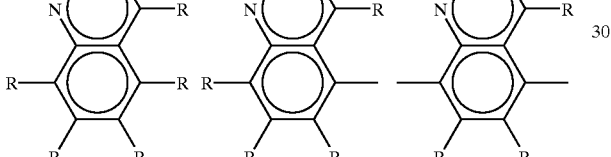
[Chemical formulae 16]
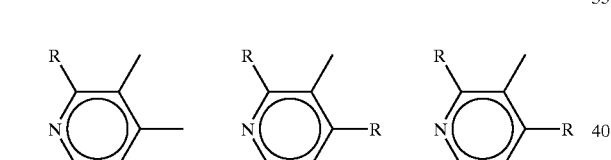
-continued
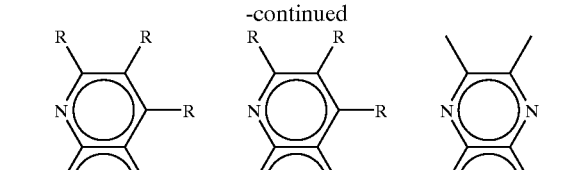
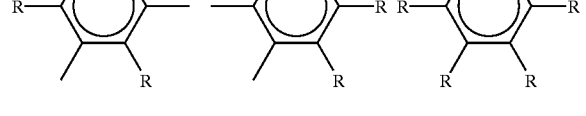
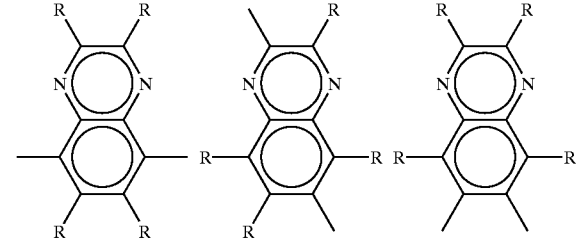
[Chemical formulae 17]
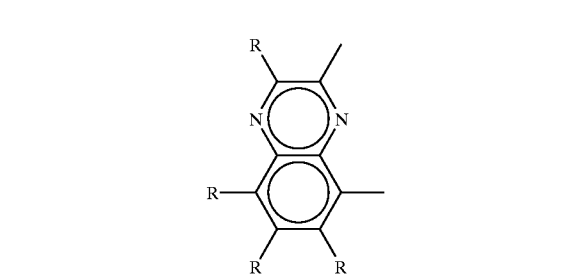
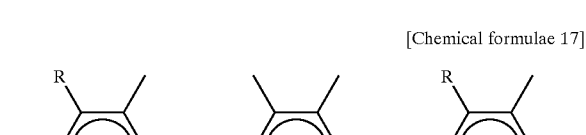
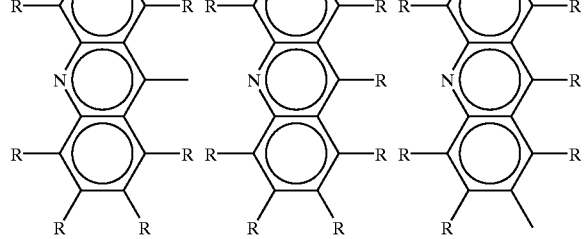
[Chemical formulae 18]
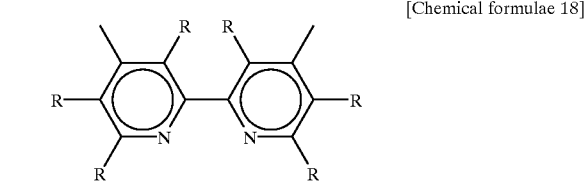

-continued
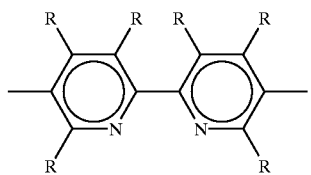
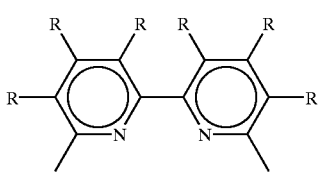
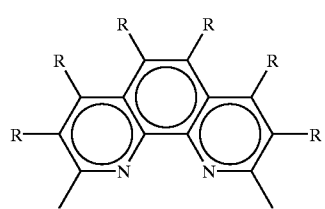
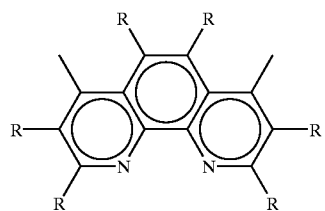
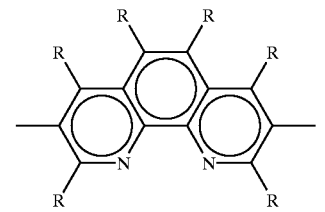
[Chemical formulae 19]
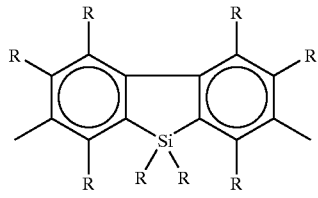
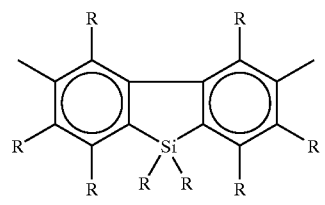
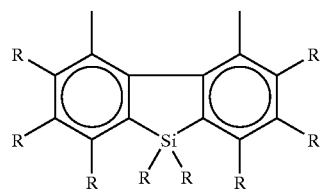
-continued
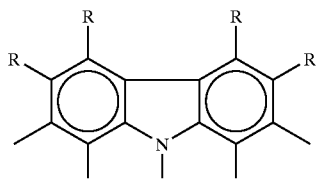
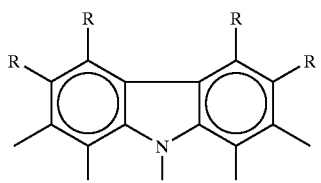
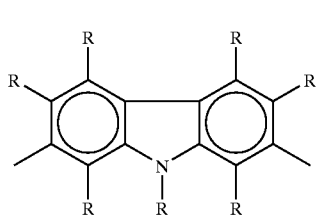
[Chemical formulae 20]
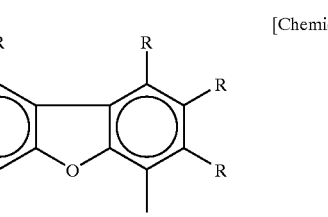
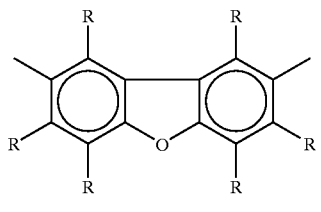
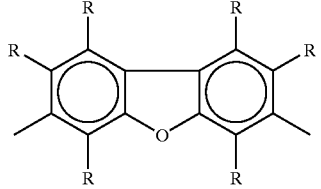
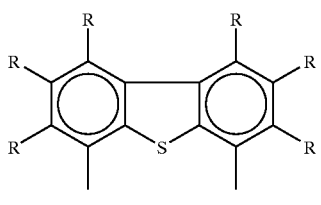
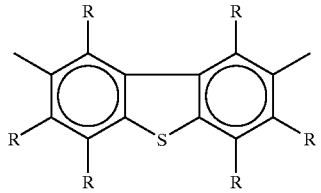

-continued
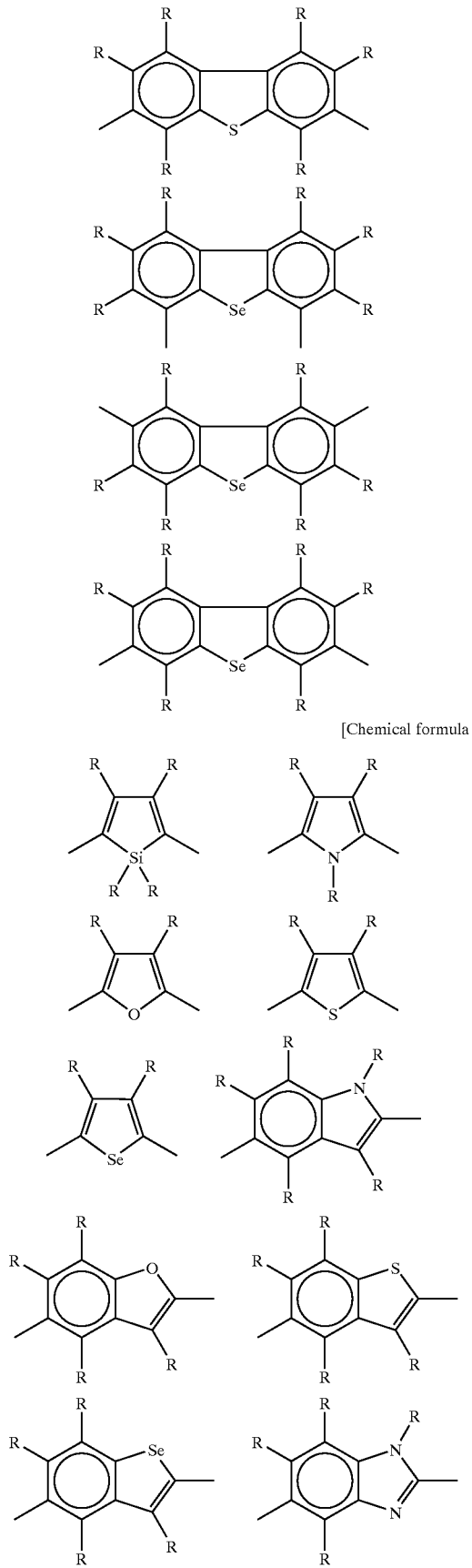
[Chemical formula 21]
-continued
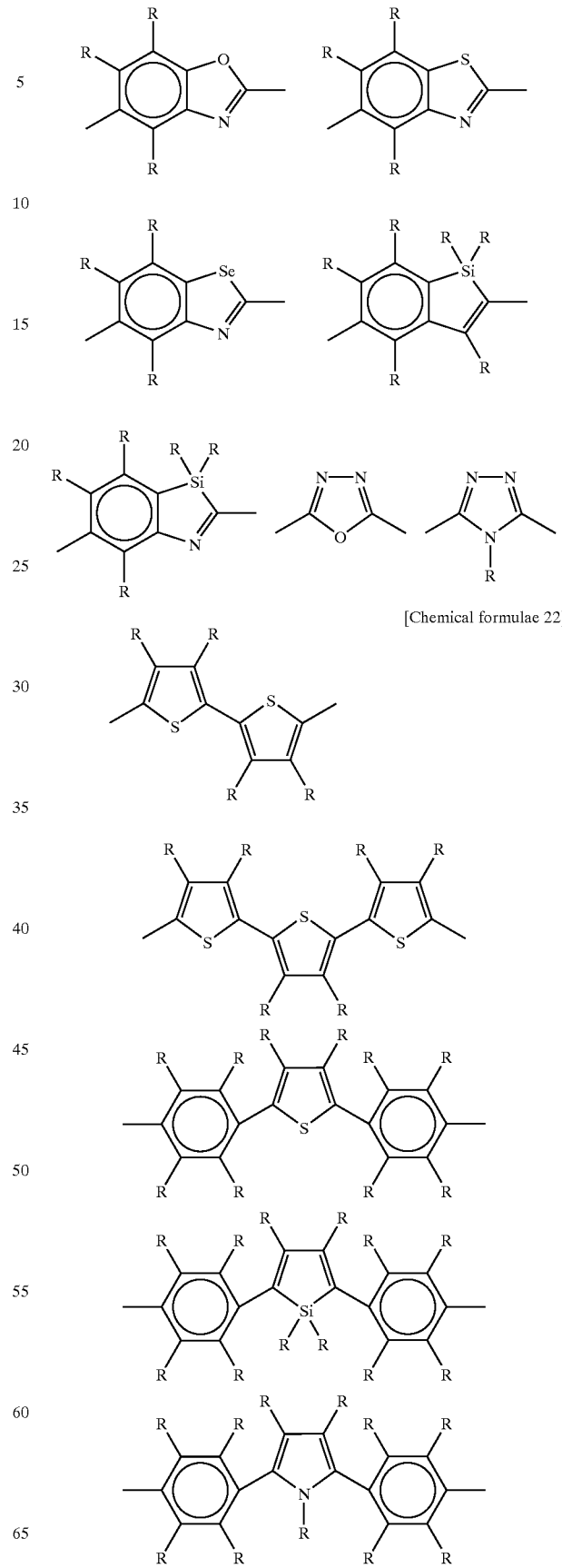
[Chemical formulae 22]

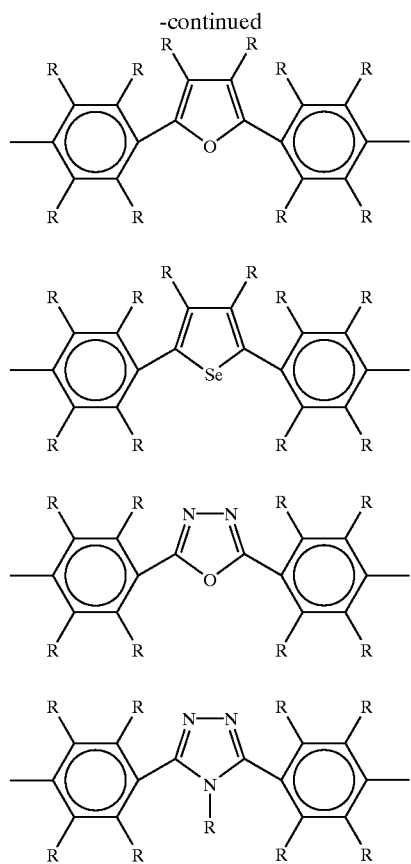

Wherein, R represents a hydrogen atom, a substituent described in the structural formulae (1) to (8) (excepting substituents of a vinylene group), or other substituent. Herein, the number of the substituent described in the structural formulae (1) to (8) (excepting substituents of a vinylene group), substitutable in the above-described structural formulae is from 1 to 4. When R represents other than a hydrogen atom, examples thereof include alkyl groups of 1 to 20 carbon atoms, alkoxy groups of 1 to 20 carbon atoms, alkylthio groups of 1 to 20 carbon atoms, alkylsilyl groups of 1 to 60 carbon atoms, alkylamino groups of 1 to 40 carbon atoms, aryl groups of 6 to 60 carbon atoms, aryloxy groups of 6 to 60 carbon atoms, arylalkyl groups of 7 to 60 carbon atoms, arylalkoxy groups of 7 to 60 carbon atoms, arylalkenyl groups of 8 to 60 carbon atoms, arylalkynyl groups of 8 to 60 carbon atoms, arylamino groups of 6 to 60 carbon atoms, heterocyclic compound groups of 4 to 60 carbon atoms and cyano group and the like, however, other substituents may also be included.

In the above-described examples, a plurality of Rs are present in one structural formula, and they may be the same or different, and selected independently. For enhancing solubility in a solvent, it is preferable that the symmetric property of a repeating unit containing substituents is low.

$Ar_2$, $Ar_4$, $Ar_6$, $Ar_8$, $Ar_{10}$, $Ar_{12}$, $Ar_{14}$ and $Ar_{16}$ are specific groups selected from the following $Ar_A$ to $Ar_D$ groups.

$Ar_A$ group; aryl groups of 6 to 60 carbon atoms, heterocyclic compound groups of 4 to 60 carbon atoms $Ar_B$ group; cyclic saturated hydrocarbon groups of 5 to 16 carbon atoms $Ar_C$ group; saturated heterocyclic hydrocarbon groups of 4 to 60 carbon atoms $Ar_D$ group; alkyl groups of 5 to 20 carbon atoms or arylalkyl groups of 7 to 60 carbon atoms $Ar_2$ have at least one substituent selected from the group consisting of alkyl groups of 5 to 20 carbon atoms, alkoxy groups of 5 to 20 carbon atoms, alkylthio groups of 5 to 20 carbon atoms, alkylsilyl groups of 5 to 60 carbon atoms, alkylamino groups of 5 to 40 carbon atoms, aryl groups of 6 to 60 carbon atoms, aryloxy groups of 6 to 60 carbon atoms, arylalkyl groups of 7 to 60 carbon atoms, arylalkoxy groups of 7 to 60 carbon atoms, arylalkenyl groups of 8 to 60 carbon atoms, arylalkynyl groups of 8 to 60 carbon atoms, arylamino groups of 6 to 60 carbon atoms, heterocyclic compound groups of 4 to 60 carbon atoms and a cyano group.

$Ar_4$ have at least one substituent selected from the group consisting of alkyl groups of 1 to 20 carbon atoms, alkoxy groups of 1 to 20 carbon atoms, alkylthio groups of 1 to 20 carbon atoms, alkylsilyl groups of 1 to 60 carbon atoms, alkylamino groups of 1 to 40 carbon atoms, aryl groups of 6 to 60 carbon atoms, aryloxy groups of 6 to 60 carbon atoms, arylalkyl groups of 7 to 60 carbon atoms, arylalkoxy groups of 7 to 60 carbon atoms, arylalkenyl groups of 8 to 60 carbon atoms, arylalkynyl groups of 8 to 60 carbon atoms, arylamino groups of 6 to 60 carbon atoms, heterocyclic compound groups of 4 to 60 carbon atoms and a cyano group.

Herein, specific examples of aryl groups of 6 to 60 carbon atoms, heterocyclic compound groups of 4 to 60 carbon atoms, cyclic saturated hydrocarbon groups of 5 to 16 carbon atoms and saturated heterocyclic compound groups of 4 to 60 carbon atoms include those groups exemplified in the following chemical formulae 23 to 29. Of them, examples of the aryl groups are shown in the chemical formula 23, examples of the heterocyclic compound groups are shown in the chemical formulae 24, 25, 28 and 29, and examples of the cyclic saturated hydrocarbon groups are shown in the chemical formulae 26 and 27. The saturated heterocyclic compound groups are those having no unsaturated bond in the heterocyclic compound groups, and groups exemplified in the chemical formulae 28 and 29 are listed.

[Chemical formulae 23]

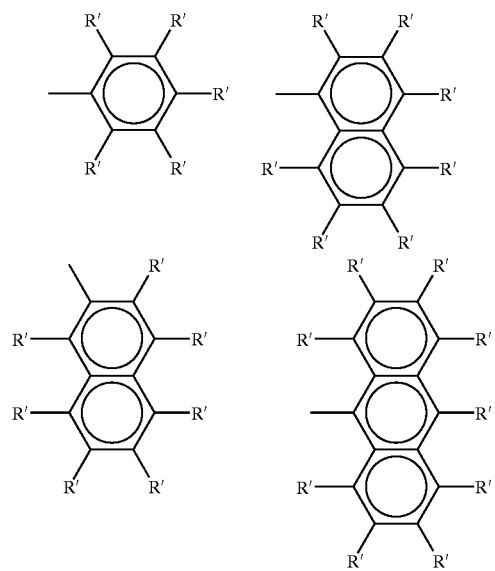

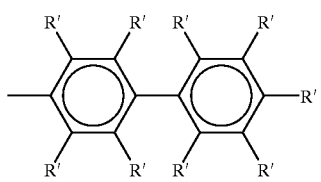
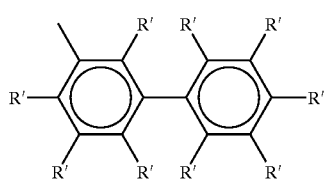
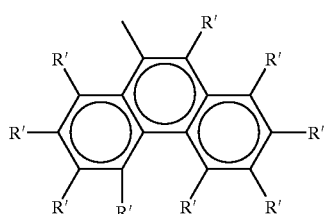
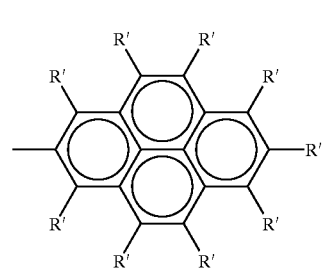
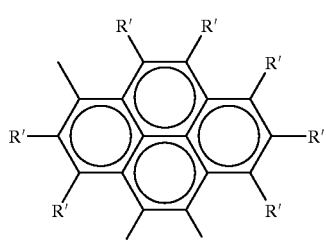
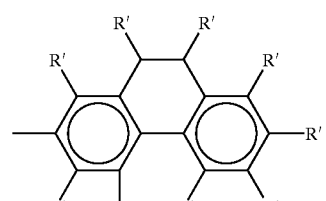
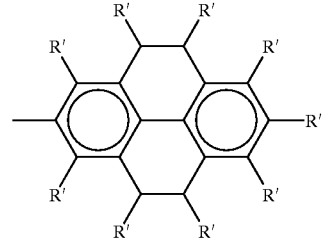
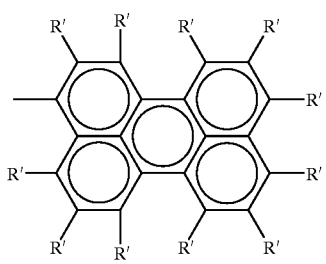
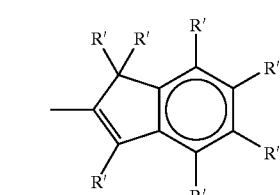
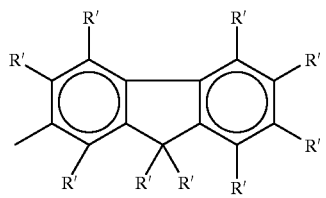
[Chemical formulae 24]
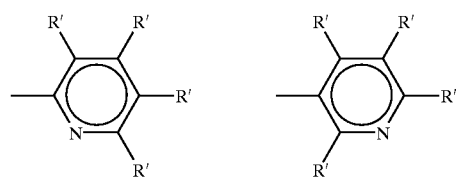
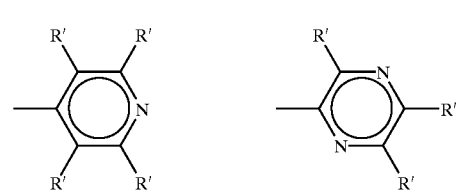
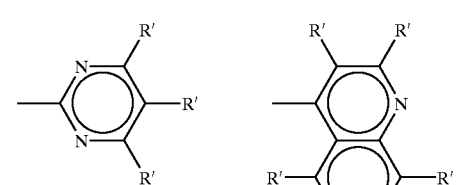
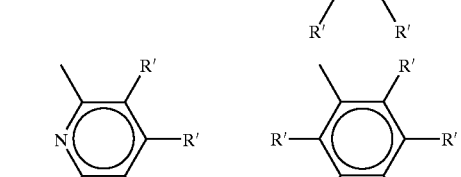
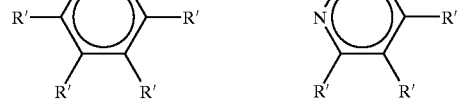

25
-continued
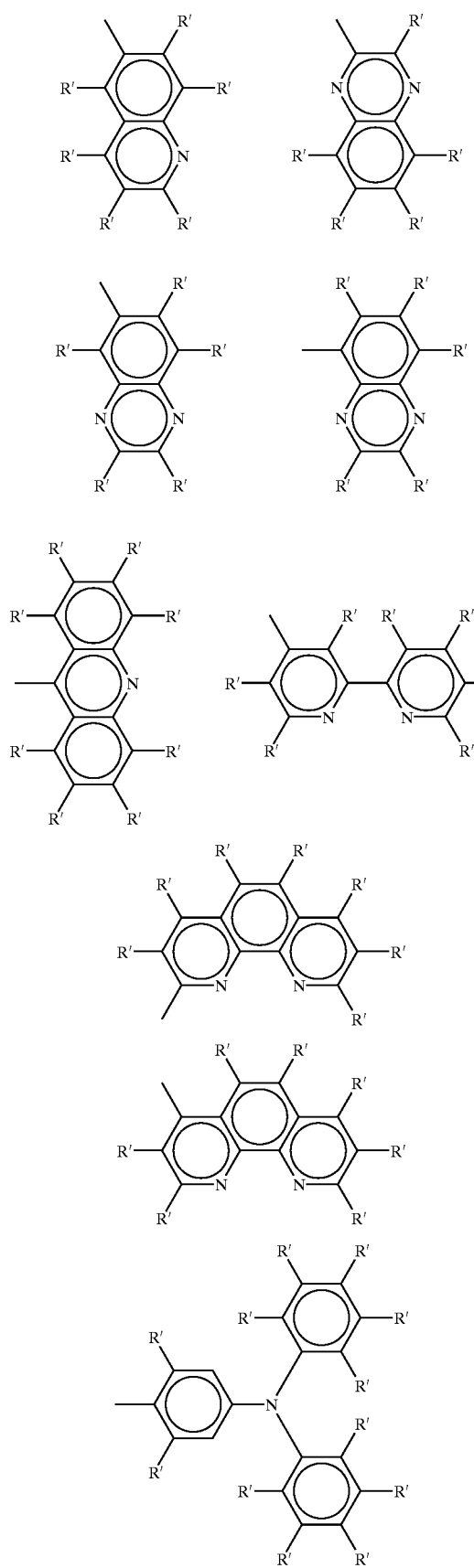
26
-continued
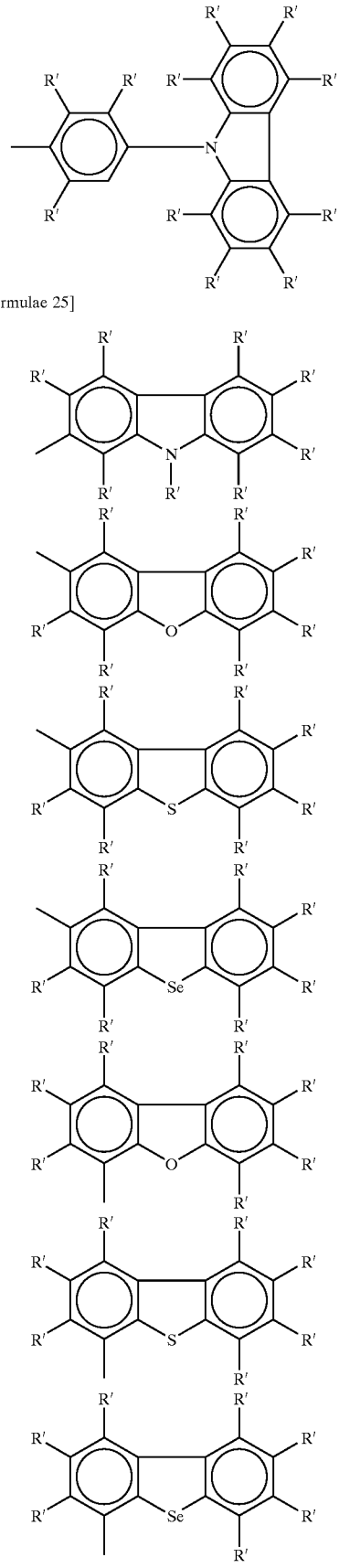
[Chemical formulae 25]

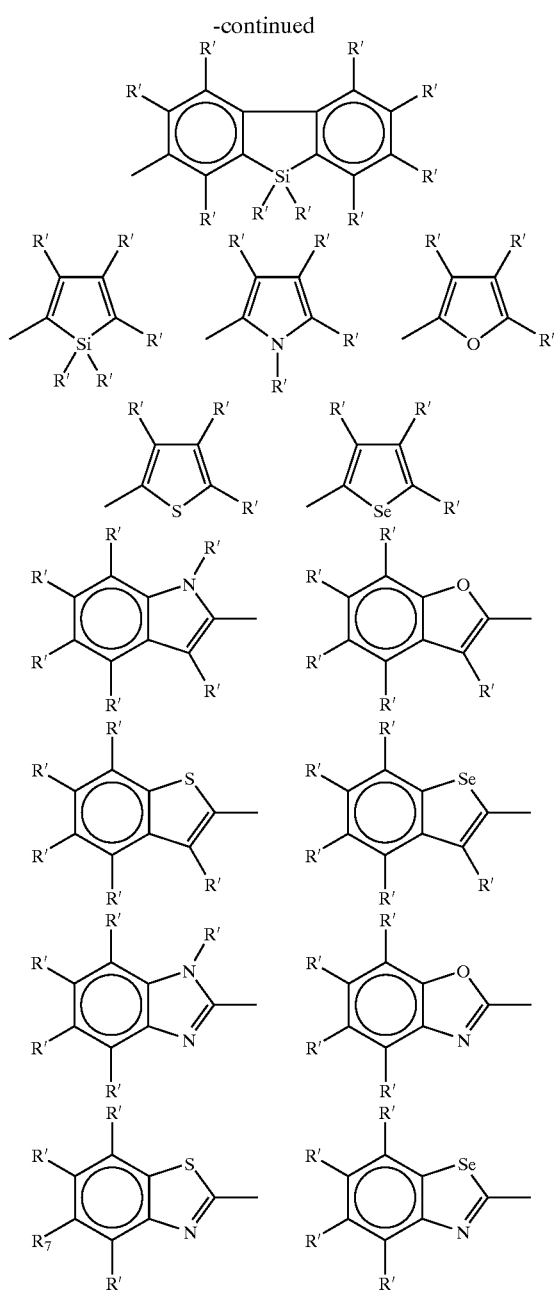
[Chemical formulae 26]
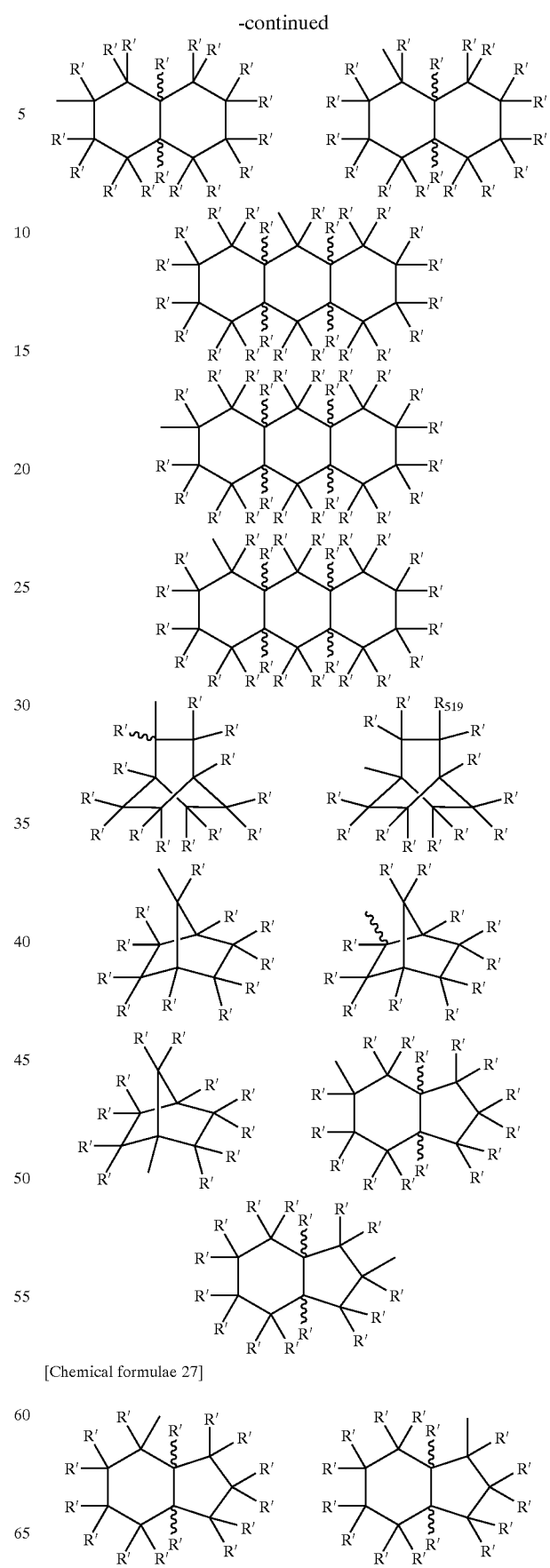
[Chemical formulae 27]

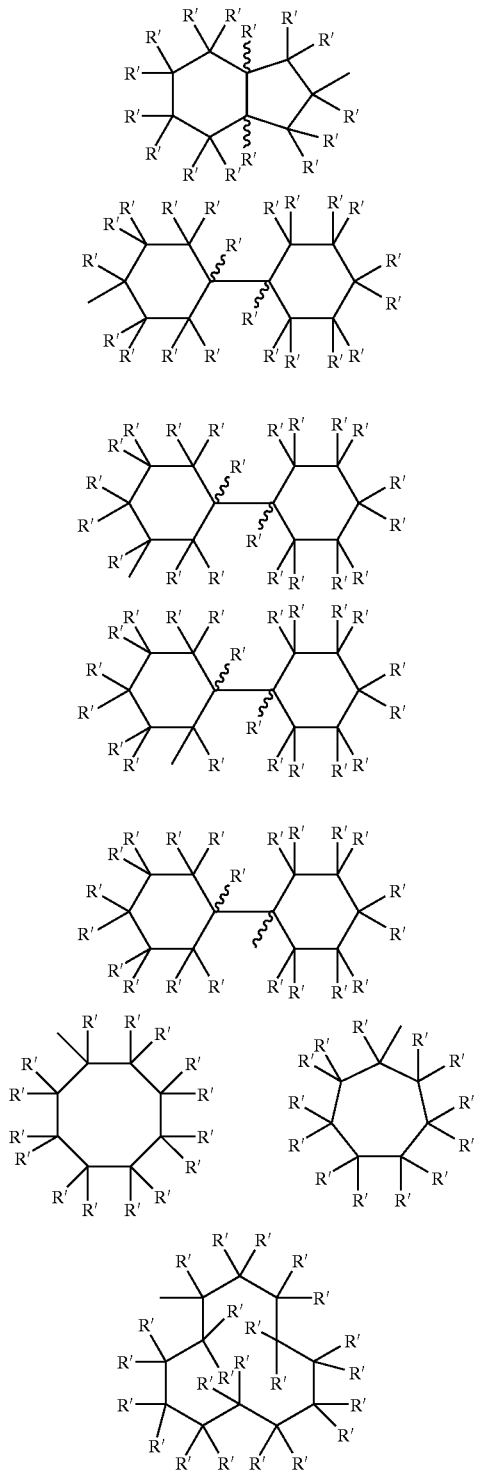
[Chemical formulae 28]
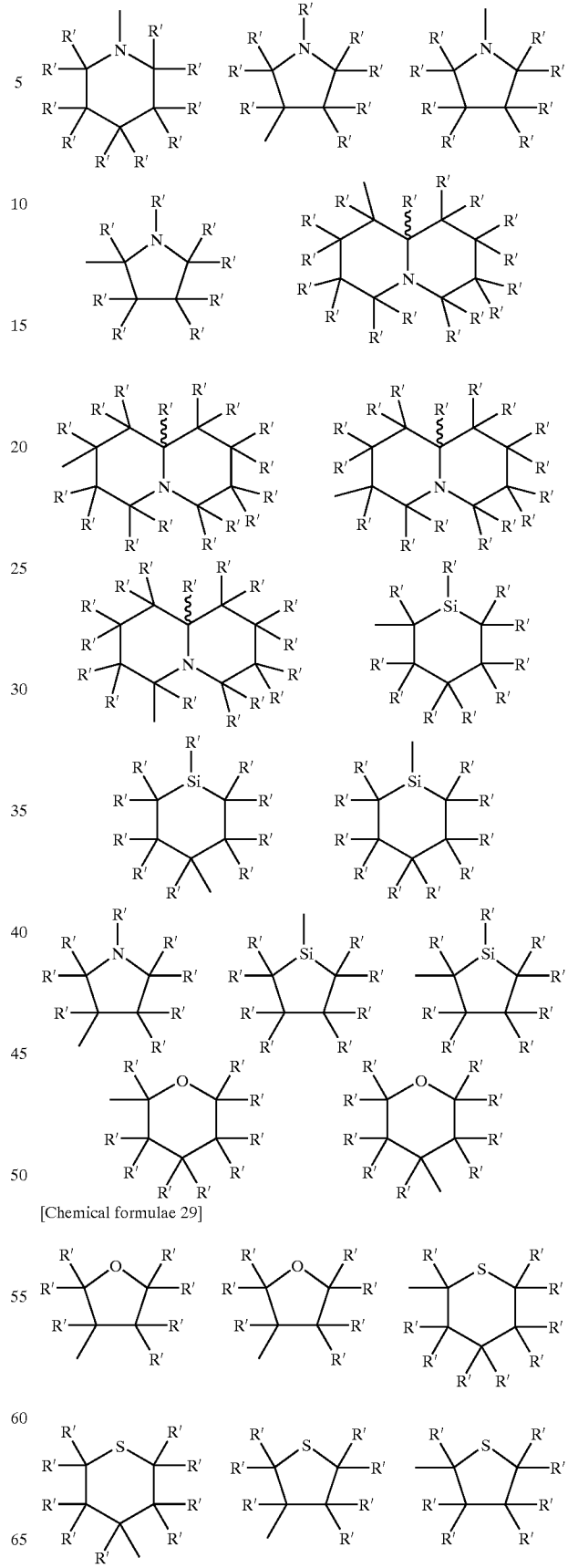
[Chemical formulae 29]

Herein, R' represents a hydrogen atom or a substituent, and examples of R' other than a hydrogen atom include alkyl groups of 1 to 20 carbon atoms, alkoxy groups of 1 to 20 carbon atoms, alkylthio groups of 1 to 20 carbon atoms, alkylsilyl groups of 1 to 60 carbon atoms, alkylamino groups of 1 to 40 carbon atoms, aryl groups of 6 to 60 carbon atoms, aryloxy groups of 6 to 60 carbon atoms, arylalkyl groups of 7 to 60 carbon atoms, arylalkoxy groups of 7 to 60 carbon atoms, arylalkenyl groups of 8 to 60 carbon atoms, arylalkynyl groups of 8 to 60 carbon atoms, arylamino groups of 6 to 60 carbon atoms, heterocyclic compound groups of 4 to 60 carbon atoms and a cyano group, and other substituents than these groups may be included.

In the above-described examples, a plurality of Rs are present in one structural formula, and they may be the same or different, and selected independently.

$X_1$, $X_2$, $X_3$, $X_4$ and $X_5$ are specific groups selected from the following $X_A$ to $X_C$ groups.

$X_A$ group; carbon-carbon single bond $X_B$ group; —O—, —S—

$X_C$ group; —CR"=CR"—, —C≡C—, —SiR"R"—, —NR"—, —CO—, —CO—O—, —O—CO—, —SO$_2$—

Namely, $X_1$ and $X_4$ are groups selected from $X_C$ group, $X_2$ is a group selected from $X_A$ group and $X_B$ group, $X_3$ is a group selected from $X_B$ group and $X_C$ group, and $X_5$ is a group selected from $X_B$ group. Herein, R"s each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group.

Of examples of R and R', in substituents containing an alkyl group, they may be any of linear, branched or cyclic, or a combination thereof, and in the case of not linear, examples thereof include an isobutyl group, isoamyl group, 2-ethylhexyl group, 3,7-dimethyloctyl group, cyclohexyl group, 4-$C_1$ to $C_{12}$ alkylcyclohexyl group and the like. For enhancing the solubility of a polymeric fluorescent substance in a solvent, it is preferable that a cyclic or branched alkyl chain is contained in one or more of the above-described substituents. Further, ends of two alkyl chains may also bond to form a ring. Furthermore, some —CH$_2$— groups in the alkyl chain may also be replaced with groups selected from the above-described $X_B$ group and $X_C$ group.

Of examples of R and R', when R and R' contain aryl groups or heterocyclic compound groups in these structures, those groups may also contain further one or more substituents.

$R_1$, $R_2$, $R_{13}$, $R_{14}$, $R_{20}$, $R_{21}$, $R_{32}$, $R_{33}$, $R_{39}$, $R_{40}$, $R_{51}$, $R_{52}$, $R_{58}$, $R_{59}$, $R_{65}$ and $R_{66}$ contained in the structural formulae (1) to (8) each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group.

Regarding specific substituents, examples of the alkyl groups of 1 to 20 carbon atoms include a methyl group, ethyl group, propyl group, butyl group, pentyl group, hexyl group, heptyl group, octyl group, nonyl group, decyl group, lauryl group and the like, and a pentyl group, hexyl group, octyl group and decyl group are preferable. Included in examples of the alkyl groups of 5 to 20 carbon atoms are a pentyl group, hexyl group, heptyl group, octyl group, nonyl group, decyl group, lauryl group and the like, and a pentyl group, hexyl group, octyl group and decyl group are preferable.

Given as examples of the alkoxy groups of 1 to 20 carbon atoms are a methoxy group, ethoxy group, propyloxy group, butoxy group, pentyloxy group, hexyloxy group, heptyloxy group, octyloxy group, nonyloxy group, decyloxy group, lauryloxy group and the like and a pentyloxy group, hexyloxy group, octyloxy group and decyloxyl group are preferable. Included in examples of the alkoxy groups of 5 to 20 carbon atoms are a pentyloxy group, hexyloxy group, heptyloxy group, octyloxy group, nonyloxy group, decyloxy group, lauryloxy group and the like, and a pentyloxy group, hexyloxy group, octyloxy group and decyloxy group are preferable.

Examples of the alkylthio groups of 1 to 20 carbon atoms include a methylthio group, ethylthio group, propylthio group, butylthio group, pentylthio group, hexylthio group, heptylthio group, octylthio group, nonylthio group, decylthio group, laurylthio group and the like, and a pentylthio group, hexylthio group, octylthio group and decylthio group are preferable. Included in examples of the alkylthio group of 5 to 20 carbon atoms are apentylthio group, hexylthio group, heptylthio group, octylthio group, nonylthio group, decylthio group, laurylthio group and the like, and a pentylthio group, hexylthio group, octylthio group and decylthio group are preferable.

Examples of the alkylsilyl group of 1 to 60 carbon atoms include a methylsilyl group, ethylsilyl group, propylsilyl group, butylsilyl group, pentylsilyl group, hexylsilyl group, heptylsilyl group, octylsilyl group, nonylsilyl group, decylsilyl group, laurylsilyl group, trimethylsilyl group, ethyldimethylsilyl group, propyldimethylsilyl group, butyldimethylsilyl group, pentyldimethylsilyl group, hexyldimethylsilyl group, heptyldimethylsilyl group, octyldimethylsilyl group, nonyldimethylsilyl group, decyldimethylsilyl group, lauryldimethylsilyl group and the like, and a pentylsilyl group, hexylsilyl group, octylsilyl group, decylsilyl group, pentyldimethylsilyl group, hexyldimethylsilyl group, octyldimethylsilyl group and decyldimethylsilyl group are preferable. Given as examples of the alkylsilyl group of 5 to 60 carbon atoms are a triethylsilyl group, tripropylsilyl group, tributylsilyl group, tripentylsilyl group, trihexylsilyl group, triheptylsilyl group, trioctylsilyl group, trinonylsilyl group, tridecylsilyl group, trilaurylsilyl group, propyldimethylsilyl group, butyldimethylsilyl group, pentyldimethylsilyl group, hexyldimethylsilyl group, heptyldimethylsilyl group, octyldimethylsilyl group. nonyldimethylsilyl group, decyldimethylsilyl group, lauryldimethylsilyl group and the like, and a tripentylsilyl group, trihexylsilyl group, trioctylsilyl group, tridecylsilyl group, pentyldimethylsilyl group, hexyldimethylsilyl group, octyldimethylsilyl group and decyldimethylsilyl group are preferable.

Examples of the alkylamino groups of 1 to 40 carbon atoms include a methylamino group, dimethylamino group, ethylamino group, propylamino group, butylamino group, pentylamino group, hexylamino group, heptylamino group, octylamino group, nonylamino group, decylamino group, laurylamino group and the like, and a pentylamino group, hexylamino group, octylamino group and decylamino group are preferable. Included in examples of the alkylamino groups of 5 to 40 carbon atoms are a pentylamino group, hexylamino group, heptylamino group, octylamino group, nonylamino group, decylamino group, laurylamino group, dipropylamino group, dibutylamino group, dipentylamino group, dihexylamino group, diheptylamino group, dioctylamino group, dinonylamino group, didecylamino group, dilaurylamino group and the like, and a pentylamino group, hexylamino group, octylamino group, decylamino group, dipentylamino group, dihexylamino group, dioctylamino group and didecylamino group are preferable.

Examples of the aryl groups of 6 to 60 carbon atoms include a phenyl group, $C_1$ to $C_{12}$ alkoxyphenyl groups ($C_1$ to $C_{12}$ indicates 1 to 12 carbon atoms: hereinafter the same), $C_1$ to $C_{12}$ alkylphenyl groups, 1-naphthyl group, 2-naphthyl group and the like, and $C_1$ to $C_{12}$ alkoxyphenyl groups and $C_1$ to $C_{12}$ alkylphenyl groups are preferable.

Examples of the aryloxy groups of 6 to 60 carbon atoms include a phenoxy group, $C_1$ to $C_{12}$ alkoxyphenoxy groups, $C_1$ to $C_{12}$ alkylphenoxy groups, 1-naphthyloxy group, 2-naphthyloxy group and the like, and $C_1$ to $C_{12}$ alkoxyphenoxy groups and $C_1$ to $C_{12}$ alkylphenoxy groups are preferable.

Examples of the arylalkyl groups of 7 to 60 carbon atoms include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_{12}$ to $C_{12}$ alkyl groups, 1-naphthyl-$C_1$ to $C_{12}$ alkyl groups, 2-naphthyl-$C_1$ to $C_{12}$ alkyl groups and the like, and $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups are preferable. More specific examples thereof include a phenylmethyl group, phenylethyl group, phenylpropyl group, $C_1$ to $C_{12}$ alkoxyphenylmethyl group, $C_1$ to $C_{12}$ alkoxyphenylethyl group, $C_1$ to $C_{12}$ alkoxyphenylpropyl group, $C_1$ to $C_{12}$ alkylphenylmethyl group, $C_1$ to $C_{12}$ alkylphenylethyl group, $C_1$ to $C_{12}$ alkylphenylpropyl group, naphthylmethyl group, naphthylethyl group, naphthylpropyl group and the like, and $C_1$ to $C_{12}$ alkoxyphenylmethyl group, $C_1$ to $C_{12}$ alkoxyphenylethyl group, $C_1$ to $C_{12}$ alkoxyphenylpropyl group, $C_1$ to $C_{12}$ alkylphenylmethyl group, $C_1$ to $C_{12}$ alkylphenylethyl group and $C_1$ to $C_{12}$ alkylphenylpropyl group are preferable.

Examples of the arylalkoxy groups of 7 to 60 carbon atoms include phenyl-$C_1$ to $C_{12}$ alkoxy groups, $C_1$ to $C_{12}$ alkoxyphenyl-$C_1$ to $C_{12}$ alkoxy groups, $C_1$ to $C_{12}$ alkylphenyl-$C_{12}$ to $C_{12}$ alkoxy groups, 1-naphthyl-$C_1$ to $C_{12}$ alkoxy groups, 2-naphthyl-$C_1$ to $C_{12}$ alkoxy groups and the like, and $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups are preferable. More specific examples thereof include a phenylmethoxy group, phenylethoxy group, phenylpropyloxy group, $C_1$ to $C_{12}$ alkoxyphenylmethoxy group, $C_1$ to $C_{12}$ alkoxyphenylethoxy group, $C_1$ to $C_{12}$ alkoxyphenylpropyloxy group, $C_1$ to $C_{12}$ alkylphenylmethoxy group, $C_1$ to $C_{12}$ alkylphenylethoxy group, $C_1$ to $C_{12}$ alkylphenylpropyloxy group, naphthylmethoxy group, naphthylethoxy group, naphthylpropyloxy group and the like, and $C_1$ to $C_{12}$ alkoxyphenylmethoxy group, $C_1$ to $C_{12}$ alkoxyphenylethoxy group, $C_1$ to $C_{12}$ alkoxyphenylpropyloxy group, $C_1$ to $C_{12}$ alkylphenylmethoxy group, $C_1$ to $C_{12}$ alkylphenylethoxy group and $C_1$ to $C_{12}$ alkylphenylpropyloxy group are preferable.

Examples of the arylalkenyl groups of 6 to 60 carbon atoms include a phenylethenyl group, $C_1$ to $C_{12}$ alkoxyphenylethenyl groups, $C_1$ to $C_{12}$ alkylphenylethenyl groups, naphthylethenyl group, anthrylethenyl group, pyrenylethenyl group and the like, and $C_1$ to $C_{12}$ alkoxyphenylethenyl groups and $C_1$ to $C_{12}$ alkylphenylethenyl groups are preferable.

Examples of the arylalkynyl groups of 6 to 60 carbon atoms include a phenylethynyl group, $C_1$ to $C_{12}$ alkoxyphenylethynyl groups, $C_1$ to $C_{12}$ alkylphenylethynyl groups, naphthylethynyl group, anthrylethynyl group, pyrenylethynyl group and the like, and $C_1$ to $C_{12}$ alkoxyphenylethynyl groups and $C_1$ to $C_{12}$ alkylphenylethynyl groups are preferable.

Examples of the arylamino groups of 7 to 60 carbon atoms include a phenylamino group, diphenylamino group, $C_1$ to $C_{12}$ alkoxyphenylamino groups, bis($C_1$ to $C_{12}$ alkoxyphenyl)amino groups, bis($C_1$ to $C_{12}$ alkylphenyl) amino groups, 1-naphthylamino group, 2-naphthylamino group and the like, and $C_1$ to $C_{12}$ alkoxyphenylamino groups and bis($C_1$ to $C_{12}$ alkoxyphenyl)amino groups are preferable.

Examples of the heterocyclic compound groups of 4 to 60 carbon atoms include a thienyl group, $C_1$ to $C_{12}$ alkylthienyl groups, pyrrolyl group, furyl group, pyridyl group, $C_1$ to $C_{12}$ alkylpyridyl groups and the like, and a thienyl group, $C_1$ to $C_{12}$ alkylthienyl groups, pyridyl group and $C_1$ to $C_{12}$ alkylpyridyl groups are preferable.

The terminal group of a polymeric fluorescent substance is not particularly restricted, and since if a active polymerizable group remains intact, light emitting property and life, when the material is used in an device, may possibly decrease, the terminal group may also be protected or replaced with a stable group. Those having a conjugated bond continued to the conjugated structure of the main chain are preferable, and there are exemplified structures containing a bond to an aryl group or a heterocyclic compound group via a vinylene group. Specifically, substituents described in JP-A No. 9-45478, chemical formula 10, and the like are exemplified.

For synthesizing this polymeric fluorescent substance, when the main chain has vinylene groups, there are exemplified methods described in JP-A No. 5-202355. Namely, there are exemplified polymerization of dialdehyde compounds with diphosphonium salt compounds or of compounds having both of aldehyde and phosphonium salt groups by the Wittig reaction, polymerization of divinyl compounds with dihalogen compounds or of vinylhalogen compounds alone by the Heck reaction, polymerization of dialdehyde compounds with a bisphosphate ester compound or of compounds having both of aldehyde and phosphate ester groups by the Horner-Wadsworth-Emmons method, polycondensation of compounds having two methyl halide groups by a dehydrohalogenation method, polycondensation of compounds having two sulfonium salt groups by a sulfonium salt decomposing method, polymerization of dialdehyde compounds with diacetonitrile compounds or of compounds having both of aldehyde and acetonitrile groups by the Knoevenagel reaction, polymerization of dialdehyde compounds by the McMurry reaction, polymerization of compounds having both of aromatic Schiff base and methyl groups by the Siegrist reaction, and the like.

Further, when the main chain does not have a vinylene group, there are exemplified a method in which polymerization is conducted from the corresponding monomer by the Suzuki coupling reaction, a method in which polymerization is conducted by the Grignard reaction, a method in which polymerization is conducted using a Ni (0) catalyst, a method in which polymerization is conducted using an oxidizing agents such as $FeCl_3$ and the like, a method in which oxidation polymerization is conducted electrochemically, a method in which an intermediate polymer having a suitable releasing group is decomposed, and the like.

This polymeric fluorescent substance may contain other repeating unit than the repeating unit of the formulae (1) to (8) in the range wherein luminescent property and charge transport property do not deteriorate. The repeating unit of the formulae (1) to (8) or other unit than the repeating unit of the formulae (1) to (8) may be connected via a non-conjugated unit, or such non-conjugated part may also contained in the repeating unit. As the linkage structure, there are exemplified those shown in the following chemical formula 30, combinations of those shown in the following chemical formula 30 with a vinylene group, combinations of two or more of those shown in the following chemical formula 30, and the like. Herein, Rs each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group, and Ar represents a hydrocarbon group of 6 to 60 carbon atoms, Specific examples of these groups are the same as those exemplified above.

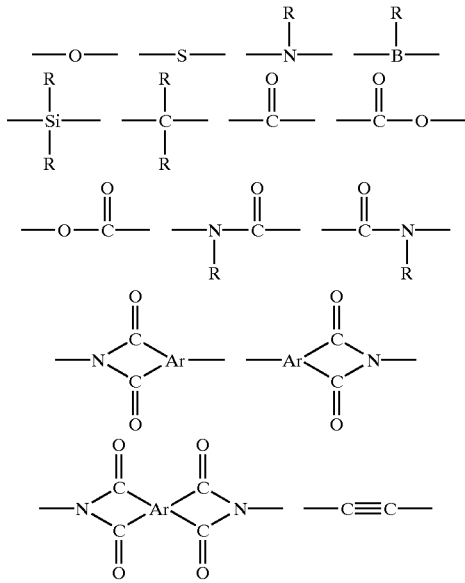

This polymeric fluorescent substance may also be a random, block or graft copolymer, or a polymer having an intermediate structure thereof, for example, a random copolymer having blocking property. From the viewpoint for obtaining a polymeric fluorescent substance having high fluorescent quantum yield, random copolymers having blocking property and block or graft copolymers are more preferable than complete random copolymers. Dendrimers or copolymers having branching in the main chain and having three or more terminals are also included.

Further, as the polymeric fluorescent substance, those emitting fluorescence in a solid state are suitably used, since the material utilizes light emission from a thin film.

As good solvents for the polymeric fluorescent substance, there are exemplified chloroform, methylene chloride, dichloroethane, tetrahydrofuran, toluene, xylene, mesitylene, tetralin, decalin, n-butylbenzene and the like. The polymeric fluorescent substance can be usually dissolved in these solvents in an amount of 0.1 wt % or more, though the amount differs depending on the structure and molecular weight of the polymeric fluorescent substance.

The polymeric fluorescent substance has a number-average molecular weight of $10^3$ to $10^8$ in terms of polystyrene, and the degree of polymerization thereof also changes depending on repeating structures and proportion thereof. From the standpoint of film forming property, generally the total amount of repeating structures is preferably from 20 to 10000, more preferably from 30 to 10000, particularly preferably from 50 to 5000.

When these polymeric fluorescent substances are used as a light emitting material of a polymer LED, the purity thereof exerts an influence on light emitting property, therefore, it is preferable that a monomer before polymerization is purified by a method such as distillation, sublimation purification, re-crystallization and the like before being polymerized and further, it is preferable to conduct a purification treatment such as re-precipitation purification, chromatographic separation and the like after the synthesis.

Next, the polymer LED of the present invention will be illustrated. The polymer LED of the present invention is a polymer LED comprising a pair of electrodes composed of an anode and a cathode at least one of which is transparent or semitransparent and a light emitting layer disposed between the electrodes, and a polymeric fluorescent substance of the present invention is contained in the light emitting layer.

As the polymer LED of the present invention, there are listed polymer LEDs having an electron transporting layer disposed between a cathode and a light emitting layer, polymer LEDs having a hole transporting layer disposed between an anode and a light emitting layer, polymer LEDs having an electron transporting layer disposed between a cathode and a light emitting layer and having a hole transporting layer disposed between an anode and a light emitting layer.

For example, the following structures a) to d) are specifically exemplified.
a) anode/light emitting layer/cathode
b) anode/hole transporting layer/light emitting layer/cathode
c) anode/light emitting layer/electron transporting layer//cathode
d) anode/hole transporting layer/light emitting layer/electron transporting layer/cathode (wherein, /indicates adjacent lamination of layers. Hereinafter, the same).

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer.

The light emitting layer, hole transporting layer and electron transporting layer may also each independently used in two or more layers.

Of charge transporting layers disposed adjacent to an electrode, that having function to improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.
e) anode/charge injecting layer/light emitting layer/cathode f) anode/light emitting layer/charge injecting layer/cathode g) anode/charge injecting layer/light emitting layer/charge injecting layer/cathode h) anode/charge injecting layer/hole transporting layer/light emitting layer/cathode i) anode/hole transporting layer/light emitting layer/charge injecting layer/cathode j) anode/charge injecting layer/hole transporting layer/light emitting layer/charge injecting layer/cathode k) anode/charge injecting layer/light emitting layer/electron transporting layer/cathode l) anode/light emitting layer/electron transporting layer/charge injecting layer/cathode m) anode/charge injecting layer/light emitting layer/electron transporting layer/charge injecting layer/cathode n) anode/charge injecting layer/hole transporting layer/light emitting layer/electron transporting layer/cathode o) anode/hole transporting layer/light emitting layer/electron transporting layer/charge injecting layer/cathode p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode In producing a polymer LED, when a film is formed from a solution by using such polymeric fluorescent substance soluble in an organic solvent, only required is removal of the solvent by drying after coating of this solution, and even in the case of mixing of a charge transporting material and a light emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light emitting layer, the optimum value differs depending on material used, and may properly be selected so that the driving voltage and the light emitting efficiency become optimum values, and for example, it is from 1 nm to 1 µm, preferably from 2 nm to 500 nm, further preferably from 5 nm to 200 nm.

In the polymer LED of the present invention, light emitting materials other than the above-described polymeric fluorescent substance can also be mixed in a light emitting layer. Further, in the polymer LED of the present invention, the light emitting layer containing light emitting materials other than the above-described polymeric fluorescent substance may also be laminated with a light emitting layer containing the above-described polymeric fluorescent substance.

As the light emitting material, known materials can be used. In a compound having lower molecular weight, there can be used, for example, naphthalene derivatives, an thracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methyl methacrylate), polystyrene, poly (vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 µm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t- butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 $\mu$m, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that an anode is transparent or semitransparent, and as the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium tin oxide (ITO), indium zinc oxide and the like, which are metal oxide complexes, and gold, platinum, silver, copper and the like are used, and among them, ITO, indium.zinc.oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 $\mu$m, preferably from 20 nm to 1 $\mu$m, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 $\mu$m, preferably from 20 nm to 1 $\mu$m, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric fluorescent substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

EXAMPLES

The following examples further illustrate the present invention in detail but do not limit the scope thereof.

Herein, regarding the number average molecular weight, a number average molecular weight in terms of polystyrene was measured by gel permeation chromatography (GPC) using chloroform as a solvent.

Example 1
<Synthesis of Monomer 1>

Under inert atmosphere, to 23 parts by weight of 4-(4-propylcyclohexyl) ethylbenzene and 12 parts by weight of p-formaldehyde was added 200 parts by weight of a solution of hydrogen bromide and acetic acid, and the mixture was stirred at room temperature for 1 hour, then, heated at 85° C. for 40 hours for reaction. After cooling to room temperature, ion-exchanged water was added, and the product separated was recovered. The recovered product was washed with water several times, then, dried under reduced pressure to obtain 22 parts by weight of a crude product. This was purified by silica gel column chromatography. The resulted product is called Monomer 1.
<Synthesis of Polymeric Fluorescent Substance 1>

Under insert atmosphere, 4.2 parts by weight of Monomer 1 and 0.067 parts by weight of 2-methoxy-5-(2-ethylhexyloxy)-p-xylylene dichloride were dissolved in 350 parts by weight of dry 1,4-dioxane, nitrogen was bubbled through the solution for 15 minutes for deaeration, then, the solution was heated to 95° C. To this solution was added a solution of 2.9 parts by weight of potassium t-butoxide and 40 parts by weight of dry 1,4-dioxane over 5 minutes dropwise. Further, the solution was heated to 97° C., then, a solution of 2.24 parts by weight of potassium t-butoxide and 30 parts by weight of dry 1,4-dioxane was added dropwise over 1 minute, and the solution was kept at 98° C. for 2 hours for reaction. Then, the solution was cooled to 50° C., and to this was added a mixed solution of acetic acid/1,4-dioxane for neutralization. After cooling to room temperature, the resulted solution was poured into ion-exchanged water under stir. Then, the precipitate was filtrated, and washed with methanol. This was dried under reduced pressure at 50° C., then, purified by re-precipitation from tetrahydrofuran/methanol. The precipitate was dried under reduced pressure to obtain 0.3 parts by weight of a polymer. The resulted polymer is referred to as polymeric fluorescent substance 1.

The number-average molecular weight in terms of polystyrene of polymeric fluorescent substance 1 was $2.6 \times 10^4$. The structure of polymeric fluorescent substance 1 was analyzed by $^1$H-NMR to obtain a spectrum corresponding to a copolymer of 2-methoxy-5-(2-ethylhexyloxy)-p-phenylene vinylene and 2-ethyl-4-(4-propylcyclohexyl)-p-phenylene vinylene of molar ratio of about 5:95.
<Fabrication and Evaluation of the Device>

On a glass substrate provided with an ITO film having a thickness of 150 nm by a sputtering method, a 0.4 wt % chloroform solution of polymeric fluorescent substance 1 was spin-coated to form a film having a thickness of 70 nm. Further, this was dried at 80° C. under reduced pressure for 1 hour, then, calcium was vapor-deposited to a thickness of 25 nm and then aluminum was vapor-deposited to a thickness of 40 nm as a cathode, to give a polymer LED. The degrees of vacuum in the vapor-deposition were kept 1 to $8 \times 10^{-6}$ Torr during deposition. The resulted device showed a luminance of 1 cd/m$^2$ at an applied voltage of 4.8 V and the maximum luminance was 5610 cd/m$^2$. The maximum electroluminescent efficiency was 1.0 cd/A. The electroluminescent peak wavelength was 538 nm, corresponding approximately to the fluorescent peak wavelength of a thin film of polymeric fluorescent substance 1, which indicated that the emission came from polymeric fluorescent substance 1.

Example 2
<Synthesis of Polymeric Fluorescent Substance 2>

Monomer 1 was reacted with triphenylphosphine in a N,N-dimethylformamide solvent to synthesize a phosphonium salt. 2.0 parts by weight of the resulted phosphonium salt and 0.78 parts by weight of 2,5-dioctyloxyterephthalaldehyde were dissoved in 60 parts by weight of an ethanol/toluene mixed solvent. To this solution was added dropwise, at room temperature, 25 parts by weight of a solution prepared by previously mixing 5 parts by weight of a 12% solution of lithiummethoxide in methanol and 20 parts by weight of ethanol. After the addition, the solution was allowed to react for 5 hours subsequently at room temperature.

After left over night at room temperature, the produced precipitate was recovered and washed with ethanol. Then, this precipitate was dissolved in toluene, and to this was added methanol to cause re-precipitation for purification. This was dried under reduced pressure to obtain 0.1 part by weight of a polymer. The resulted polymer is referred to as polymeric fluorescent substance 2.

The number-average molecular weight in terms of polystyrene of polymeric fluorescent substance 2 was $4 \times 10^3$. The structure of polymeric fluorescent substance 2 was analyzed by $^1$H-NMR to obtain a spectrum corresponding to an alternating copolymer of 2,5-dioctyl-p-phenylene vinylene and 2-ethyl-4-(4-propylcyclohexyl)-p-penylene vinylene.

<Fabrication and Evaluation of the Device>

On a glass substrate provided with an ITO film having a thickness of 150nm by a sputtering method, a 1.0% chloroform solution of polyvinylcarbazole was spin-coated to form a film having a thickness of 120 nm. On this, a 2.0 wt % toluene solution of polymeric fluorescent substance 2 was spin-coated to form a film having a thickness of 45 nm. Further, this was dried at 80° C. under reduced pressure for 1 hour, then, calcium was vapor-deposited to a thickness of 25 nm and then aluminum was vapor-deposited to a thickness of 40 nm as a cathode, to give a polymer LED. The degrees of vacuum in the vapor-deposition were kept 1 to $8 \times 10^{-6}$ Torr during deposition. The resulted device showed a luminance of 1 cd/m$^2$ at an applied voltage of 13.8 V and the maximum luminance was 2742 cd/m$^2$. The maximum electroluminescent efficiency was 0.9 cd/A. The electroluminescent peak wavelength was 522 nm, corresponding approximately to the fluorescent peak wavelength of a thin film of polymeric fluorescent substance 2, which indicated that the emission came from polymeric fluorescent substance 2. The luminance was approximately in proportion to the current density.

Example 3

<Synthesis of 2,5-Dimethyl-1-(2-(4-octyloxyphenyl)ethenyl)benzene>

2,5-dimethylbenzyl chloride was reacted with triphenylphosphine in a N,N-dimethylformamide solvent to synthesize a phosphonium salt. 19.42 g of the resulted phosphonium salt and 12.03 g of 4-n-octyloxybenzaldehyde were dissolved in a mixed solvent of dry ethyl alcohol/chloroform under dry argon atmosphere. To this solution was added a mixed solution of methyl alcohol/ethyl alcohol containing 2.68 g of lithium methoxide at room temperature dropwise, and the mixture was stirred for 5 hours at room temperature. The solvents were removed by distillation from the reaction solution, and the residue was washed with ethyl alcohol. This was filtrated, and washed with a mixed solvent of ethyl alcohol/water, and ethyl alcohol, then, dried under reduced pressure at 50° C. to obtain 7.47 g of a white solid.

The resulted product showed a nuclear magnetic resonance spectrum ($^1$H-NMR) corresponding to 2,5-dimethyl-1-(2-(4-octyloxyphenyl)ethenyl)benzene (Most of the ethenyl group in this compound had trans conformation)

$^1$H-NMR: 0.88–0.94 [m] (methyl group of octyloxy group), 1.32–1.87 [m] (methylene group not bonding to oxygen atom octyloxy group) 2.36 [s] (methyl group), 2.39 [s] (methyl group), 3.98 [t] (methylene group bonding to oxygen atom of octyloxy group), 6.87–7.49 [m] (aromatic group)

<Synthesis of 2,5-Bis(bromomethyl)-1-(2-(4-octyloxyphenyl)ethenyl)benzene>

Under dry argon atmosphere, into a solution of 7.01 g of the above-described 2,5-dimethyl-1-(2-(4-octyloxyphenyl)ethenyl)benzene in carbon tetrachloride were added at 70° C. 9.33 g of N-bromosuccinimide and 0.25 g of 2,2'-azobis (isobutyronitrile), and the mixture was stirred at reflux temperature for 5 hours and a half. The reaction solution was left to cool, the salt was removed by filtration, and the solvent was removed by distillation. The residue (viscous liquid) was added to 3 ml of ethyl acetate, and left over night at 0° C., then, the precipitated solid was filtrated, and re-crystallized from ethyl alcohol to obtain 0.5 g of a white solid. The resulted product showed a nuclear $^1$H-NMR spectrum corresponding to 2,5-bis(bromomethyl)-1-(2-(4-octyloxyphenyl)ethenyl)benzene (Most of the ethenyl group in this compound had trans conformation).

$^1$H-NMR: 0.85–0.91 [m] (methyl group of octyloxy group), 1.30–1.85 [m] (methylene group not bonding to oxygen atom octyloxy group), 3.98 [t] (methylene group bonding to oxygen atom of octyloxy group), 4.49 [s] (bromomethyl group), 4.59 [s] (bromomethyl group), 6.88–7.63 [m] (aromatic group).

<Synthesis of Polymeric Fluorescent Substance 3>

Under dry argon atmosphere, to 70 ml of dry dioxane from which oxygen has been removed by bubbling of argon was added 3 ml of a solution of 0.5 g of the above-described 2,5-bis(bromomethyl)-1-(2-(4-octylocyphenyl)ethenyl)benzene in dry dioxane and the solution was heated to 95° C. To this solution was added dropwise 2.8 ml out of 5 ml of a solution of 0.533 g of potassium t-butoxide in dry dioxane, and the mixture was stirred for 5 minutes. Then, 2.2 ml of the residual solution was added dropwise. The mixture was stirred for 2 hours at 100° C., then, a mixed solution of 0.26 g of acetic acid and 0.26 g of dioxane was added at 50° C., and the mixture was stirred for 10 minutes. After cooling to room temperature, the reaction solution was poured into 100 ml of distilled water under stir, to precipitate a polymer. This polymer was filtrated, and washed with methanol, then, was dried under reduced pressure at 50° C., to obtain 0.26 g of an orange crude polymer.

Under dry argon atmosphere, to 27 ml of tetrahydrofuran from which oxygen has been removed by bubbling of argon was added this crude polymer, and the mixture was heated to 60° C. and stirred for 1 hour. The solution was colored orange, however, insoluble portion remained. This solution was allowed to cool to room temperature, then, 27 ml of methyl alcohol was added to precipitate a polymer. This polymer was filtrated, washed with methyl alcohol, and dried under reduced pressure at 50° C. to obtain 0.17 g of an orange polymer. The resulted polymer was poly[2-(2-(4-octyloxyphenyl)ethenyl)-1,4-phenylene)vinylene]. This is referred to as polymeric fluorescent substance 3.

The number-average molecular weight in terms of polystyrene of polymeric fluorescent substance 3 was $7.9 \times 10^3$. The structure of polymeric fluorescent substance 3 was analyzed by $^1$H-NMR to obtain a spectrum corresponding to poly[2-(2-(4-octyloxyphenyl)ethenyl)-1,4-phenylene) vinylene]. Polymeric fluorescent substance 3 had extremely strong fluorescence, and the fluorescent peak wavelength was 542 nm. Polymeric fluorescent substance 3 could be dissolved inorganic solvents such as toluene, chloriform and the like.

<Fabrication and Evaluation of the Device>

On a glass substrate provided with an ITO film having a thickness of 150 nm by a sputtering method, a 0.4 wt % chloroform solution of polymeric fluorescent substance 3 was spin-coated to form a film having a thickness of 100 nm. Further, this was dried at 80° C. under reduced pressure for 1 hour, then, calcium was vapor-deposited to a thickness of 25 nm and then aluminum was vapor-deposited to a thickness of 40 nm as a cathode, to give a polymer LED. The degrees of vacuum in the vapor-deposition were kept 1 to $8 \times 10^{-6}$ Torr during deposition. The resulted device was applied with voltage to show electroluminescence from polymeric fluorescent substance 3. The luminance was approximately in proportion to the current density, the voltage at which the luminance was over 1 cd/m$^2$ was about 3 V, and the electroluminescent efficiency was about 0.2 cd/A.

Example 4

<Synthesis of Polymeric Fluorescent Substance 4>

2 g of a bromomethylated compound of p-(2-ethylhexyl) toluene and 0.067 g of 2-methoxy-5-(2-ethylhexyloxy)-p-xylylene dichloride were dissolved in 350 g of dry 1,4-dioxane, nitrogen was bubbled through the solution for 15 minutes of deaeration, then, the reaction solution was heated to 95° C. To this solution was added a solution of 1.4 g of potassium t-butoxide and 20 g of dry [1,4-dixone]1,4-dioxane over 5 minutes dropwise. Further, this solution was heated to 97° C., then, a solution of 1.2 g of potassium t-butoxide and 15 g of dry 1,4-dioxane was added dropwise. The solution was kept at 98° C. for 2 hours for reaction. After the reaction, the solution was cooled to 50° C., and to this was added to a mixed solution of acetic acid/1,4-dioxane for neutralization. After cooling to room temperature, the resulted solution was poured into ion-exchanged water under stir. Then, the precipitate was filtered, and washed with methanol. This was dried under reduced pressure to obtain 0.3 g of a polymer.

Then, this was dissolved into tetrahydrofuran, and the mixture was poured into methanol to cause re-precipitation for purification. This precipitate was washed with ethanol, then, dried under reduced pressure to obtain polymeric fluorescent substance 4.

The number-average molecular weight in terms of polystyrene of polymeric fluorescent substance 4 was $6.4 \times 10^4$. The structure of polymeric fluorescent substance 4 was analyzed by 1H-NMR to obtain a spectrum corresponding to a copolymer of 2-methoxy-5-(2-ethylhexyl)-p-phenylene vinylene and 2-methoxy-5-(2-ethylhexyloxy)-p-phenylene vinylene of molar ratio of about 92:8.

Example 5
<Synthesis of Polymeric Fluorescent Substance 5>

2.44 g of 2,5-dioctyl-p-xylylene dibromide and 0.13 g of 2-methoxy-5-(2-ethylhexyloxy)-p-xylylene dichloride were dissolved in 150 g of xylene, then, to this was added dropwise a solution prepared by dissolving 3.36 g of potassium t-butoxide into 30 g of tetrahydrofuran at room temperature, then, the solution was allowed to react for 7 hours subsequently. Then, this reaction solution was poured into methanol containing 1.8 ml glacial acetic acid to produce a red precipitate which was recovered by filtration.

Then, this precipitate was washed with ethanol, then, washed repeatedly with an ethanol/ion-exchanged water mixed solvent, and finally washed with ethanol. This was dried under reduced pressure to obtain 1.5 g of a polymer. Then, this polymer was dissolved in chloroform. This polymer solution was poured into methanol to cause re-precipitation for purification. The precipitate was recovered, then, dried under reduced pressure to obtain polymeric fluorescent substance 5.

The number-average molecular weight in terms of polystyrene of polymeric fluorescent substance 5 was $4.0 \times 10^5$. The structure of polymeric fluorescent substance 5 was analyzed by $^1$H-NMR to obtain a spectrum corresponding to a copolymer of 2,5-dioctyl-p-phenylene vinylene and 2-methoxy-5-(2-ethylhexyloxy)-p-phenylene vinylene of molar ration of about 96:4.

Example 6
<Synthesis of Polymeric Fluorescent Substance 6>

2.44 g of 2,5-dioctyl-p-xylylene dibromide and 0.21 g of methoxy-5-(2-ethylhexyoxy)-p-xylylene dichloride were dissolved in 300 g of dry 1,4-dioxane, nitrogen was bubbled through the solution for 15 minutes for deaeration, then, the reaction solution was heated to 90° C. To this solution was added a solution of 1.4 g of potassium t-butoxide and 20 g of dry [1,4-dixone]1,4-dioxane over 5 minutes dropwise. Further, this solution was heated to 97° C., then, a solution of 1.2 g of potassium t-butoxide and 15 g of dry 1,4-dioxane was added dropwise. The solution was kept at 95° C., then, a solution of 1.2 g of potassium t-butoxide and 15 g of dry 1,4-dioxane was added dropwise. The solution was kept at 95° C. for 3 hours for reaction. After the reaction, the solution was cooled to 50° C., and to this was added a mixed solution of acetic acid/1,4-dioxane for neutralization. After cooling to room temperature, this reaction solution was poured into ion-exchanged water under stir.

Then, the precipitate was filtrated, and washed with ethanol. This was dried under reduced pressure to obtain 1.1 g of a polymer. Then, this was dissolved into chloroform, and the mixture was poured into methanol to cause re-precipitation for purification. This precipitate was washed with ethanol, then, dried under reduced pressure to obtain polymeric fluorescent substance 6.

The number-average molecular weight in terms of polystyrene of polymeric fluorescent substance 6 was $3.6 \times 10^5$. The structure of polymeric fluorescent substance 6 was analyzed by $^1$H-NMR to obtain a spectrum corresponding to a copolymer of 2,5-dioctyl-p-phenylene vinylene and 2-methoxy-5-(2-ethylhexyloxy)-p-phenylene vinylene of molar ratio of about 92:8.

Example 7
<Synthesis of Polymeric Fluorescent Substance 7>

2.44 g of 2,5-dioctyl-p-xylylene dibromide and 0.17 g of 2,5-dioctyloxy-p-xylylene dichloride were dissolved in 150 g of xylene, then, to this was added dropwise a solution prepared by dissolving 3.36 g of potassium t-butoxide into 30 g of tetrahydrofuran at room temperature, then, the solution was allowed to react for 7 hours subsequently. Then, this reaction solution was poured into methanol containing 1.8 ml glacial acetic acid to produce a red precipitate which was recovered by filtration.

Then, this precipitate was washed with ethanol, then, washed repeatedly with an ethanol/ion-exchanged water mixed solvent, and finally washed with ethanol. This was dried under reduced pressure to obtain 1.3 g of a polymer. Then, this polymer was dissolved in chloroform. This polymer solution was poured into methanol to cause re-precipitation for purification. The precipitate was recovered, then, dried under reduced pressure to obtain polymeric fluorescent substance 7.

The number-average molecular weight in terms of polystyrene of polymeric fluorescent substance 7 was $4.0 \times 10^5$. The structure of polymeric fluorescent substance 7 was analyzed by $^1$H-NMR to obtain a spectrum corresponding to a copolymer of 2,5-dioctyl-p-phenylenevinylene and 2,5-dioctyloxy-p-pheylenevinylene of molar ratio of about 96:4.

Comparative Example 1
<Synthesis of Polymeric Fluorescent Substance 8>

3.32 g of 2-methoxy-5-(2-ethylhexyloxy)-p-xylylene dichloride was dissolved in 300 g of tetrahydrofuran, then, to this was added dropwise a solution prepared by dissolving 6.72 g of potassium t-butoxide into 30 g of tetrahydrofuran at room temperature, then, the solution was allowed to react for 7 hours subsequently. Then, this reaction solution was poured into methanol containing 3.5 ml glacial acetic acid to produce a red precipitate which was recovered by filtration.

Then, this precipitate was washed with ethanol, then, washed repeatedly with an ethanol/ion-exchanged water mixed solvent, and finally washed with ethanol. This was dried under reduced pressure to obtain 1.3 g of a polymer. Then, this polymer was dissolved in toluene. This polymer solution was poured into methanol to cause re-precipitation for purification. The precipitate was recovered, then, dried under reduced pressure to obtain polymeric fluorescent substance 8.

The number-average molecular weight in terms of polystyrene of polymeric fluorescent substance 8 was $9.9 \times 10^4$.

The structure of polymeric fluorescent substance 8 was analyzed by ¹H-NMR to obtain a spectrum corresponding to poly(2-methoxy-5-(2-ethylhexyloxy)-p-phenylene vinylene).

Comparative Example 2
<Synthesis of Polymeric Fluorescent Substance 9>

2.44 g of 2,5-dioctyl-p-xylylene dibromide and 1.66 g of 2-methoxy-5-(2-ethylhexyloxy)-p-xylylene dichloride were dissolved in 100 g of xylene, then, to this was added dropwise a solution prepared by dissolving 6.72 g of potassium t-butoxide into 30 g of tetrahydrofuran at room temperature, then, the solution was allowed to react for 7 hours subsequently. Then, this reaction solution was poured into methanol containing 3.5 ml glacial acetic acid to produce a red precipitate which was recovered by filtration.

Then, this precipitate was washed with ethanol, then, washed repeatedly with an ethanol/ion-exchanged water mixed solvent, and finally washed with ethanol. This was dried under reduced pressure to obtain 1.7 g of a polymer. Then, this polymer was dissolved in chloroform. This polymer solution was poured into methanol to cause re-precipitation for purification. The precipitate was recovered, then, dried under reduced pressure to obtain polymeric fluorescent substance 9.

The number-average molecular weight in terms of polystyrene of polymeric fluorescent substance 9 was $6.0 \times 10^5$. The structure of polymeric fluorescent substance 9 was analyzed by ¹H-NMR to obtain a spectrum corresponding to a copolymer of 2,5-dioctyl-p-phenylenevinylene and 2-methoxy-5-(2-ethylhexyloxy)-p-phenylenevinylene of molar ratio of about 50:50.

Example 8
<Measurement of Absorption Spectrum, Luminescence Spectrum>

Polymeric fluorescent substances 5 to 9 could be dissolved in chloroform. 0.1% chloroform solutions thereof were spin-coated on quartz plates to produce thin films of the polymers. Ultraviolet visible absorption spectra and fluorescent spectra of these thin films were measured using an auto recording spectrophotometer UV365 (Shimadzu Corp.) and a fluorescent spectrophotometer 850 (Hitachi Ltd.), respectively. Further, in each polymeric fluorescent substance, fluorescent spectrum when excited at 410 nm was plotted while setting wave number on the abscissa and the area was calculated, and the resulted area was divided by the absorption at 410 nm to give fluorescent intensity (relative value). As shown in Table 1, polymeric fluorescent substances 4 to 7 in Examples 4 to 7 had stronger fluorescence than those of polymeric fluorescent substances 8 to 9 in Comparative Examples 1 to 2.

TABLE 1

|  | Polymeric fluorescent substance | Fluorescent peak (nm) | Fluorescent intensity (relative value) |
| --- | --- | --- | --- |
| Example 4 | Polymeric fluorescent substance 4 | 554 | 1.23 |
| Example 5 | Polymeric fluorescent substance 5 | 546 | 1.57 |
| Example 6 | Polymeric fluorescent substance 6 | 548 | 1.41 |

TABLE 1-continued

|  | Polymeric fluorescent substance | Fluorescent peak (nm) | Fluorescent intensity (relative value) |
| --- | --- | --- | --- |
| Example 7 | Polymeric fluorescent substance 7 | 554 | 1.19 |
| Comparative example 1 | Polymeric fluorescent substance 8 | 588 | 0.29 |
| Comparative example 2 | Polymeric fluorescent substance 9 | 578 | 0.51 |

Example 9
<Fabrication and Evaluation of the Device>

On a glass substrate provided with an ITO film having a thickness of 150 nm by a sputtering method, a 0.4 wt % chloroform solution of polymeric fluorescent substance 4 was spin-coated to form a film having a thickness of 100 nm. Further, this was dried at 80° C. under reduced pressure for 1 hour, then, calcium was vapor-deposited to a thickness of 25 nm and then aluminum was vapor-deposited to a thickness of 40 nm as a cathode, to give a polymer LED. The degrees of vacuum in the vapor-deposition were kept 1 to $8 \times 10^{-6}$ Torr during deposition. The resulted device was applied with voltage to show electroluminescence from polymeric fluorescent substance 4. The electroluminescent efficiency was 3.3 cd/A.

The polymeric fluorescent substance having a specific repeating unit of the present invention has strong fluorescence, and can be suitably used as a polymer LED and a dye for laser. Further, a polymer LED obtained by using this polymeric fluorescent substance shows lower voltage and high electoluminescent efficiency. Therefore, the polymer LED can be suitably applied as back-light of a liquid crystal display device or a light source in curved or plane form for illumination, and a display device such as a flat panel display of segment type or of dot matrix, and the like.

What is claimed is:

1. A polymeric fluorescent substance which emits a fluorescence in a solid state, has a number-average molecular weight of $10^3$ to $10^8$ in terms of polystyrene, comprises one or more repeating units of the following formula (1) and in which the total amount of said repeating units is 20 mol % or more based on the total amount of all repeating units:

wherein $Ar_1$ is an arylene group of 6 to 60 carbon atoms contained in the main chain or a heterocyclic compound group of 4 to 60 carbon atoms contained in the main chain; $Ar_2$ is a group selected from the group consisting of aryl groups of 6 to 60 carbon atoms, heterocyclic compound groups of 4 to 60 carbon atoms and cyclic saturated hydrocarbon groups of 5 to 16 carbon atoms; $X_1$ represents a group selected from the group consisting of —$CR_3$=$CR_4$—, —C≡C—, —$SiR_5R_6$—, —$NR_7$—, —CO—, —CO—O—, —O—CO— and —$SO_2$—; $Ar_2$ has at least one substituent selected from the group consisting of alkyl groups of 5 to 20 carbon atoms, alkoxy groups of 5 to 20 carbon atoms, alkylthio groups of 5 to 20 carbon atoms, alkylsilyl groups of 5 to 60 carbon atoms, alkylamino groups of 5 to 40 carbon atoms, aryl groups of 6 to 60 carbon atoms, aryloxy groups of 6 to 60 carbon atoms, arylalkyl groups of 7 to 60 carbon atoms, arylalkoxy groups of 7 to 60 carbon atoms, arylalkenyl groups of 8 to 60 carbon atoms, arylalkynyl groups of 8 to 60 carbon atoms, arylamino groups of 6 to 60 carbon atoms, heterocyclic compound groups of 4 to 60 carbon atoms and a cyano group; $Ar_2$ may also have other substituents than these substituents; when $Ar_2$ has a plurality of substituents, they may be the same or different; m is an integer from 1 to 4; $Ar_1$ may also have other substituents than substituents represented by $—X_1—Ar_2$; when $Ar_1$ has a plurality of substituents, they may be the same or different; $R_1$ to $R_7$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; when the substituent of $Ar_2$, or $R_1$ to $R_7$ include an alkyl chain, the alkyl chain may be any of linear, branched and cyclic, alternatively, and ends of a plurality of alkyl groups may bond to form a ring; one or more $—CH_2—$ groups contained in this alkyl chain may also be replaced with a group selected from the group consisting of $—O—$, $—S—$, $—CR_8=CR_9—$, $—C\equiv C—$, $—SiR_{10}R_{11}—$, $—NR_{12}—$, $—O—$, $—CO—O—$, $—O—CO—$ and $—SO_2—$; when the substituent of $Ar_2$, or $R_1$ to $R_7$ include an aryl group or a heterocyclic compound group, they may also further have a substituent; herein, $R_8$ to $R_{12}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; one or more hydrogen atoms contained in the repeating unit of the formula (1) may also be replaced with halogen atoms selected from the group consisting of F, Cl and Br; and, n is 0 or 1.

2. A polymeric fluorescent substance which emits a fluorescence in a solid state, has a number-average molecular weight of $10^3$ to $10^8$ in terms of polystyrene, comprises one or more repeating units of the following formula (2) and in which the total amount of said repeating units is 20 mol % or more based on the total amount of all repeating units:

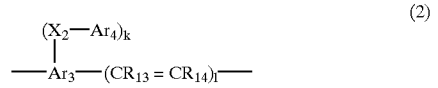

(2)

wherein $Ar_3$ is an arylene group of 6 to 60 carbon atoms contained in the main chain or a heterocyclic compound group having 4 to 60 carbon atoms contained in the main chain and having one or more atoms selected from nitrogen, oxygen and silicon; $Ar_4$ is a group selected from the group consisting of cyclic saturated hydrocarbon groups of 5 to 16 carbon atoms and saturated heterocyclic compound groups of 4 to 60 carbon atoms; $X_2$ represents a group selected from the group consisting of a carbon-carbon single bond, $—O—$ and $—S—$; $Ar_4$ has at least one substituent selected from the group consisting of alkyl groups of 1 to 20 carbon atoms, alkoxy groups of 1 to 20 carbon atoms, alkylthio groups of 1 to 20 carbon atoms, alkylsilyl groups of 1 to 60 carbon atoms, alkylamino groups of 1 to 40 carbon atoms, aryl groups of 6 to 60 carbon atoms, aryloxy groups of 6 to 60 carbon atoms, arylalkyl groups of 7 to 60 carbon atoms, arylalkoxy groups of 7 to 60 carbon atoms, arylalkenyl groups of 8 to 60 carbon atoms, arylalkynyl groups of 8 to 60 carbon atoms, arylamino groups of 6 to 60 carbon atoms, heterocyclic compound groups of 4 to 60 carbon atoms and a cyano group; $Ar_4$ may also have other substituents than these substituents; when $Ar_4$ has a plurality of substituents, they may be the same or different; k is an integer from 1 to 4; $Ar_3$ may also have other substituents than substituents represented by $—X_2—Ar_4$; when $Ar_3$ has a plurality of substituents, they may be the same or different; $R_{13}$ and $R_{14}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; when the substituent of $Ar_4$, or $R_{13}$ and $R_{14}$ include an alkyl chain, the alkyl chain may be any of linear, branched and cyclic, alternatively, and ends of a plurality of alkyl groups may bond to form a ring; one or more $—CH_2—$ groups contained in this alkyl chain may also be replaced with a group selected from the group consisting of $—O—$, $—S—$, $—CR_{15}=CR_{16}—$, $—C\equiv C—$, $—SiR_{17}R_{18}—$, $—NR_{19}—$, $—CO—$, $—CO—O—$, $—O—CO—$ and $—SO_2—$; when the substituent of $Ar_4$, or $R_{13}$ and $R_{14}$ include an aryl group or a heterocyclic compound group, they may also further have a substituent; herein, $R_{15}$ to $R_{19}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; one or more hydrogen atoms contained in the repeating unit of the formula (2) may also be replaced with halogen atoms selected from the group consisting of F, Cl and Br; and, 1 is 0 or 1.

3. A polymeric fluorescent substance which emits a fluorescence in a solid state, has a number-average molecular weight of $10^3$ to $10^8$ in terms of polystyrene, comprises one or more repeating units of the following formula (3) and one or more repeating units of the following formula (4) respectively, and in which the amount of the repeating units of the formula (3) is not less than 0.1 mol % and not more than 20 mol % based on the total amount of all repeating units and the total amount of said repeating units of the formulae (3) and (4) is 50 mol % or more based on the total amount of all repeating units:

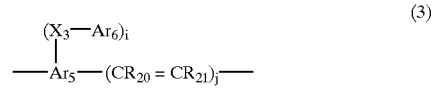

(3)

wherein $Ar_5$ is an arylene group of 6 to 60 carbon atoms contained in the main chain or a heterocyclic compound group of 4 to 60 carbon atoms contained in the main chain; $Ar_6$ is a group selected from the group consisting of aryl groups of 6 to 60 carbon atoms, heterocyclic compound groups of 4 to 60 carbon atoms and cyclic saturated hydrocarbon groups of 5 to 16 carbon atoms; $Ar_6$ may also further have a substituent; when $Ar_6$ has a plurality of substituents, they may be the same or different; $X_3$ represents a group selected from the group consisting of $—O—$, $—S—$, $—CR_{22}=CR_{23}—$, $—C\equiv C—$, $—SiR_{24}R_{25}—$, $—NR_{26}—$, $—CO—$, $—CO—O—$, $—O—CO—$ and $—SO_2—$; i is an integer from 1 to 4; $Ar_5$ may also have other substituents than substituents represented by $—X_3—Ar_6$; when $Ar_5$ has a plurality of substituents, they may be the same or different; $R_{20}$ to $R_{26}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; when the substituent of $Ar_4$, or $R_{15}$ to $R_{21}$ include an alkyl chain, the alkyl chain may be any of linear, branched and cyclic, alternatively, and ends of a plurality of alkyl groups may bond to form a ring; one or more —CH$_2$— groups contained in this alkyl chain may also be replaced with a group selected from the group consisting of —O—, —S—, —CR$_{27}$=CR$_{28}$—, —C≡C—, —SiR$_{29}$R$_{30}$—, —NR$_{31}$—, —CO—, —CO—O—, —O—CO— and —SO$_2$—; when the substituent of Ar$_6$, or R$_{20}$ to R$_{26}$ include an aryl group or a heterocyclic compound group, they may also further have a substituent; herein, R$_{27}$ to R$_{31}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; one or more hydrogen atoms contained in the repeating unit of the formula (3) may also be replaced with halogen atoms selected from the group consisting of F, Cl and Br; and, j is 0 or 1,

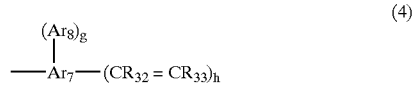
(4)

wherein Ar$_7$ is an arylene group of 6 to 60 carbon atoms contained in the main chain or a heterocyclic compound group of 4 to 60 carbon atoms contained in the main chain; Ar$_8$ is a group selected from the group consisting of alkyl groups of 5 to 20 carbon atoms, aryl groups of 6 to 60 carbon atoms, arylalkyl groups of 7 to 60 carbon atoms and heterocyclic compound groups of 4 to 60 carbon atoms; Ar$_8$ may also further have a substituent; when Ar$_8$ has a plurality of substituents, they may be the same or different; g is an integer from 1 to 4; Ar$_7$ may also have other substituents than Ar$_8$; when Ar$_7$ has a plurality of substituents, they may be the same or different; R$_{32}$ and R$_{33}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; when the substituent of Ar$_8$, or R$_{32}$ and R$_{33}$ include an alkyl chain, the alkyl chain may be any of linear, branched and cyclic, alternatively, and ends of a plurality of alkyl groups may bond to form a ring; one or more —CH$_2$— groups contained in this alkyl chain may also be replaced with a group selected from the group consisting of —O—, —S—, —CR$_{34}$=CR$_{35}$—, —C≡C—, —SiR$_{36}$R$_{37}$—, —NR$_{38}$—, —CO—, —CO—O—, —O—CO— and —SO$_2$—; when the substituent of Ar$_8$, or R$_{32}$ and R$_{33}$ include an aryl group or a heterocyclic compound group, they may also further have a substituent; herein, R$_{34}$ to R$_{38}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; one or more hydrogen atoms contained in the repeating unit of the formula (4) may also be replaced with halogen atoms selected from the group consisting of F, Cl and Br; and, h is 0 or 1.

4. A polymeric fluorescent substance which emits a fluorescence in a solid state, has a number-average molecular weight of 10$^3$ to 10$^8$ in terms of polystyrene, comprises one or more repeating units of the following formula (5) and one or more repeating units of the following formula (6) respectively, and in which the amount of the repeating units of the formula (5) is not less than 0.1 mol % and not more than 20 mol % based on the total amount of all repeating units and the total amount of said repeating units of the formulae (5) and (6) is 50 mol % or more based on the total amount of all repeating units:

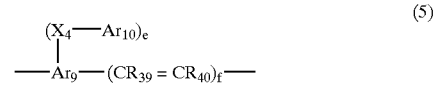
(5)

wherein Ar$_9$ is an arylene group of 6 to 60 carbon atoms contained in the main chain or a heterocyclic compound group of 4 to 60 carbon atoms contained in the main chain; Ar$_{10}$ is an alkyl group of 5 to 20 carbon atoms or an arylalkyl group of 7 to 60 carbon atoms; X$_4$ represents a group selected from the group consisting of —CR$_{41}$=CR$_{42}$—, —C≡C—, —SiR$_{43}$R$_{44}$—, —NR$_{45}$—, —CO—, —CO—O—, —O—CO— and —SO$_2$—; e is an integer from 1 to 4; Ar$_9$ may also have other substituents than substituents represented by —X$_4$—Ar$_{10}$; when Ar$_9$ has a plurality of substituents, they may be the same or different; R$_{39}$ to R$_{45}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; when the substituent of Ar$_{10}$, or R$_{39}$ and R$_{45}$ include an alkyl chain, the alkyl chain may be any of linear, branched and cyclic, alternatively, and ends of a plurality of alkyl groups may bond to form a ring; one or more —CH$_2$— groups contained in this alkyl chain may also be replaced with a group selected from the group consisting of —O—, —S—, —CR$_{46}$=CR$_{47}$—, —C≡C—, —SiR$_{48}$R$_{49}$—, —NR$_{50}$—, —CO—, —CO—O—, —O—CO— and —SO$_2$—; when the substituent of Ar$_{10}$, or R$_{39}$ to R$_{45}$ include an aryl group or a heterocyclic compound group, they may also further have a substituent; herein, R$_{46}$ to R$_{50}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; one or more hydrogen atoms contained in the repeating unit of the formula (5) may also be replaced with halogen atoms selected from the group consisting of F, Cl and Br; and, f is 0 or 1,

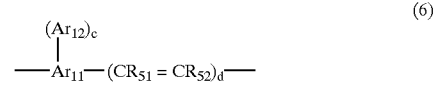
(6)

wherein Ar$_{11}$ is an arylene group of 6 to 60 carbon atoms contained in the main chain or a heterocyclic compound group of 4 to 60 carbon atoms contained in the main chain; Ar$_{12}$ is a group selected from the group consisting of alkyl groups of 5 to 20 carbon atoms, aryl groups of 6 to 60 carbon atoms, arylalkyl groups of 7 to 60 carbon atoms and heterocyclic compound groups of 4 to 60 carbon atoms; Ar$_{12}$ may also further have a substituent; when Ar$_{12}$ has a plurality of substituents, they may be the same or different; c is an integer from 1 to 4; Ar$_{11}$ may also have other substituents than Ar$_{12}$; when Ar$_{11}$ has a plurality of substituents, they may be the same or different; R$_{51}$ and R$_{52}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; when the substituent of Ar$_{12}$, or R$_{51}$ and R$_{52}$ include an alkyl chain, the alkyl chain may be any of linear, branched and cyclic, alternatively, and ends of a plurality of alkyl groups may bond to form a ring; one or more —CH$_2$— groups contained in this alkyl chain may also be replaced with a group selected from the group consisting of —O—, —S—, —CR$_{53}$=CR$_{54}$—, —C≡C—, —SiR$_{55}$R$_{56}$—, —NR$_{57}$—, —CO—, —CO—O—, —O—CO— and —SO$_2$—; when R$_{51}$ and R$_{52}$ include an aryl group or a heterocyclic compound group, they may also further have a substituent; herein, R$_{53}$ to R$_{57}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; one or more hydrogen atoms contained in the repeating unit of the formula (6) may also be replaced with halogen atoms selected from the group consisting of F, Cl and Br; and, d is 0 or 1.

5. A polymeric fluorescent substance which emits a fluorescence in a solid state, has a number-average molecular weight of $10^3$ to $10^8$ in terms of polystyrene, comprises one or more repeating units of the following formula (7) and one or more repeating units of the following formula (8) respectively, and in which the total amount of said repeating units of the formulae (7) and (8) is 50 mol % or more based on the total amount of all repeating units and the amount of the repeating units of the formula (7) is not less than 0.1 mol % and not more than 9 mol % based on the total amount of the repeating units of the formulae (7) and (8):

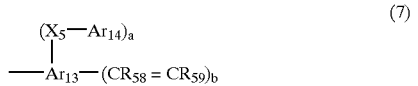

(7)

wherein Ar$_{13}$ is an arylene group of 6 to 60 carbon atoms contained in the main chain or a heterocyclic compound group of 4 to 60 carbon atoms contained in the main chain; Ar$_{14}$ is an alkyl group of 5 to 20 carbon atoms or an arylalkyl group of 7 to 60 carbon atoms; Ar$_{14}$ may also have a substituent; when Ar$_{14}$ has a plurality of substituents, they may be the same or different; X$_5$ represents a group selected from the group consisting of —O— and —S—; a is an integer from 1 to 4; Ar$_{13}$ may also have other substituents than substituents represented by —X$_5$—Ar$_{14}$; when Ar$_{13}$ has a plurality of substituents, they may be the same or different; R$_{58}$ and R$_{59}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; when the substituent of Ar$_{14}$, or R$_{58}$ and R$_{59}$ include an alkyl chain, the alkyl chain may be any of linear, branched and cyclic, alternatively, and ends of a plurality of alkyl groups may bond to form a ring; one or more —CH$_2$— groups contained in this alkyl chain may also be replaced with a group selected from the group consisting of —O—, —S—, —CR$_{60}$=CR$_{61}$—, —C≡C—, —SiR$_{62}$R$_{63}$—, —NR$_{64}$—, —CO—, —CO—O—, —O—CO— and —SO$_2$—; when the substituent of Ar$_{14}$, or R$_{58}$ to R$_{59}$ include an aryl group or a heterocyclic compound group, they may also further have a substituent; herein, R$_{60}$ to R$_{64}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; one or more hydrogen atoms contained in the repeating unit of the formula (7) may also be replaced with halogen atoms selected from the group consisting of F, Cl and Br; and, b is 0 or 1,

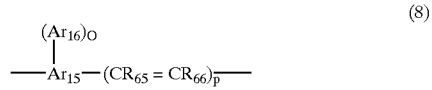

(8)

wherein Ar$_{15}$ is an arylene group of 6 to 60 carbon atoms contained in the main chain or a heterocyclic compound group of 4 to 60 carbon atoms contained in the main chain; Ar$_{16}$ is an alkyl group of 5 to 20 carbon atoms or an arylalkyl group of 7 to 60 carbon atoms; Ar$_{16}$ may also further have a substituent; when Ar$_{16}$ has a plurality of substituents, they may be the same or different; o is an integer from 1 to 4; Ar$_{15}$ may also have other substituents than Ar$_{16}$; when Ar$_{15}$ has a plurality of substituents, they may be the same or different; R$_{65}$ and R$_{66}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; when the substituent of Ar$_{16}$, or R$_{65}$ and R$_{66}$ include an alkyl chain, the alkyl chain may be any of linear, branched and cyclic, alternatively, and ends of a plurality of alkyl groups may bond to form a ring; one or more —CH$_2$— groups contained in this alkyl chain may also be replaced with a group selected from the group consisting of —O—, —S—, —CR$_{67}$=C$_{68}$—, —C≡C—, —SiR$_{69}$R$_{70}$—, —NR$_{71}$—, —CO—, —CO—O—, —O—CO— and —SO$_2$—; when the substituent of Ar$_{16}$ or R$_{65}$ and R$_{66}$ include an aryl group or a heterocyclic compound group, they may also further have a substituent; herein, R$_{67}$ to R$_{71}$ each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group; one or more hydrogen atoms contained in the repeating unit of the formula (8) may also be replaced with halogen atoms selected from the group consisting of F, Cl and Br; and, p is 0 or 1.

6. A polymer light emitting device comprising a pair of electrodes composed of an anode and a cathode at least one of which is transparent or semitransparent and at least one light emitting layer disposed between the electrodes, wherein the polymeric fluorescent substance of any of claims 1 to 5 is contained in said light emitting layer.

7. The polymer light emitting device according to claim 6, wherein a layer containing a conducting polymer is disposed at least between one electrode and the light emitting layer so that the layer containing a conducting polymer is adjacent to said electrode.

8. The polymer light emitting device according to claim 6, wherein an insulation layer having a thickness of 2 nm or less is disposed at least between one electrode and the light emitting layer so that the insulation layer is adjacent to said electrode.

9. The polymer light emitting device according to claim 6, wherein a layer comprising an electron transporting compound is disposed between the cathode and the light emitting layer so that the layer comprising an electron transporting compound is adjacent to said light emitting layer.

10. The polymer light emitting device according to claim 6, wherein a layer comprising a hole transporting compound is disposed between the anode and the light emitting layer so that the layer comprising a hole transporting compound is adjacent to said light emitting layer.

11. The polymer light emitting device according to claim 6, wherein a layer comprising an electron transporting compound is disposed between the cathode and the light emitting layer so that the layer comprising an electron transporting compound is adjacent to said light emitting layer, and a layer comprising a hole transporting compound is disposed between the anode and the light emitting layer so that the layer comprising a hole transporting compound is adjacent to said light emitting layer.

12. A flat light source comprising the polymer light emitting device of claim 6.

13. A segment display comprising the polymer light emitting device of claim 6.

14. A dot matrix display comprising the polymer light emitting device of claim 6.

15. A liquid crystal display comprising the polymer light emitting device of claim 6 as a back-light.

* * * * *